United States Patent
Yamazaki et al.

(10) Patent No.: US 8,928,010 B2
(45) Date of Patent: Jan. 6, 2015

(54) DISPLAY DEVICE

(75) Inventors: Shunpei Yamazaki, Setagaya (JP); Takayuki Ikeda, Atsugi (JP); Takeshi Aoki, Atsugi (JP); Munehiro Kozuma, Isehara (JP); Takashi Nakagawa, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 31 days.

(21) Appl. No.: 13/397,058

(22) Filed: Feb. 15, 2012

(65) Prior Publication Data
US 2012/0217515 A1     Aug. 30, 2012

(30) Foreign Application Priority Data

Feb. 25, 2011 (JP) .................... 2011-040486
Nov. 29, 2011 (JP) .................... 2011-260520

(51) Int. Cl.
*H01L 33/08* (2010.01)
*H01L 27/112* (2006.01)
*H01L 51/50* (2006.01)
*H01L 27/32* (2006.01)
*H01L 27/12* (2006.01)

(52) U.S. Cl.
CPC ........ *H01L 27/3262* (2013.01); *H01L 27/1225* (2013.01); *H01L 27/1266* (2013.01); *H01L 27/322* (2013.01)
USPC ................... 257/88; 257/79; 257/59; 257/72; 438/34; 438/35; 438/155

(58) Field of Classification Search
CPC ................ H01L 27/32; H01L 32/44
USPC ................ 257/88, 59, 72; 438/34, 35, 155
See application file for complete search history.

(56) References Cited

U.S. PATENT DOCUMENTS 7,674,650 B2   3/2010   Akimoto et al.
7,679,585 B2 *   3/2010   Kimura ................ 345/76
(Continued)

FOREIGN PATENT DOCUMENTS

JP     2006-259737 A     9/2006

OTHER PUBLICATIONS

Hong et al.,"New Pixel Design on Emitting Area for High Resolution Active-Matrix Organic Light-Emitting Diode Displays,"Dec. 2010, Journal of Display Technology, vol. 6, No. 12., pp. 601-606.*

(Continued)

*Primary Examiner* — Steven J Fulk
*Assistant Examiner* — Damon Hillman
(74) *Attorney, Agent, or Firm* — Eric J. Robinson; Robinson Intellectual Property Law Office, P.C.

(57) ABSTRACT

A display device includes a pixel area including pixels arranged in a matrix and having a horizontal resolution of 350 ppi or more and a color filter layer overlapping with the pixel area. The pixels each include a first transistor whose gate is electrically connected to a scan line and whose one of a source and a drain is electrically connected to a signal line; a second transistor whose gate is electrically connected to the other of the source and the drain of the first transistor and whose one of a source and a drain is electrically connected to a current-supplying line; and a light-emitting element electrically connected to the other of the source and the drain of the second transistor. The first and second transistors each have a channel formation region including a single crystal semiconductor.

13 Claims, 10 Drawing Sheets
(1 of 10 Drawing Sheet(s) Filed in Color)

(56) References Cited

U.S. PATENT DOCUMENTS

| | | |
|---|---|---|
| 7,688,292 B2 | 3/2010 | Park et al. |
| 7,791,072 B2 | 9/2010 | Kumomi et al. |
| 8,034,694 B2 | 10/2011 | Ohnuma et al. |
| 2006/0238135 A1 | 10/2006 | Kimura |
| 2009/0114926 A1 | 5/2009 | Yamazaki |
| 2009/0315066 A1* | 12/2009 | Kimura ............................ 257/99 |
| 2010/0006866 A1* | 1/2010 | Koyama ........................... 257/88 |
| 2012/0326951 A1* | 12/2012 | Yamazaki et al. .............. 345/76 |

OTHER PUBLICATIONS

Hong et al.,"New Pixel Design on Emitting Area for High Resolution Active-Matrix Organic Light-Emitting Diode Displays",Dec. 2010,Journal of Display Technology, vol. 6, No. 12, pp. 601-606.*

Hong et al., "New Pixel Design on Emitting Area for High Resolution Active-Matrix Organic Light-Emitting Diode Displays" Journal of Display Technology, vol. 6, No. 12, Dec. 2010, pp. 601-606.*

* cited by examiner

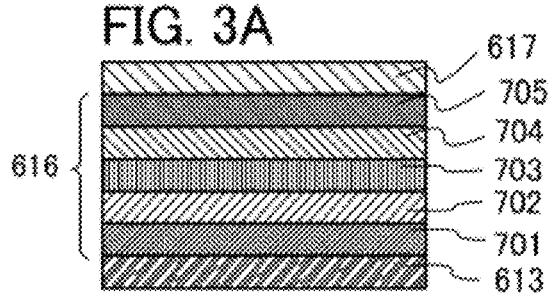
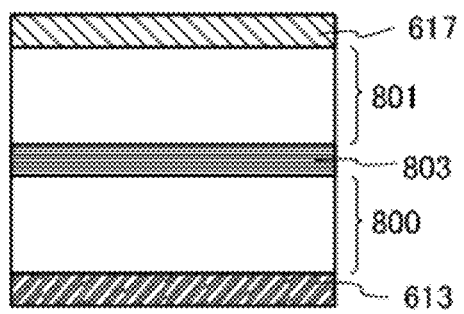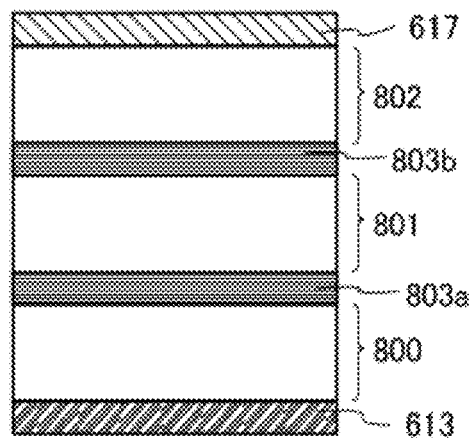
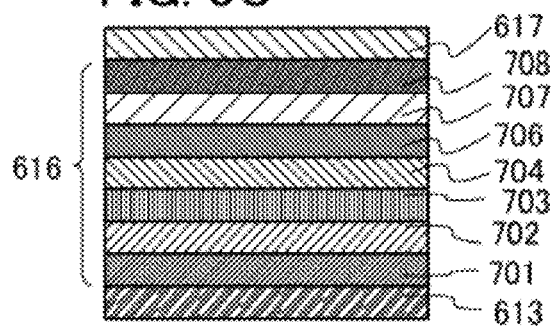

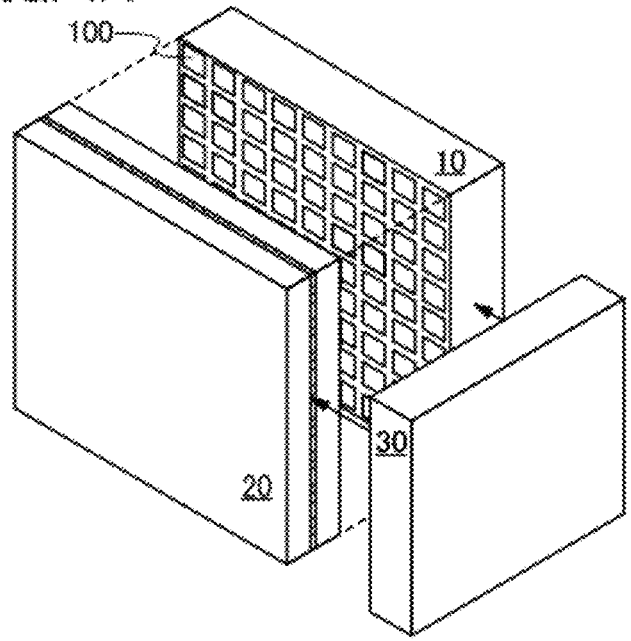
FIG. 4A
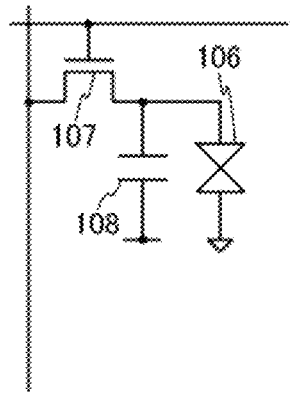
FIG. 4B
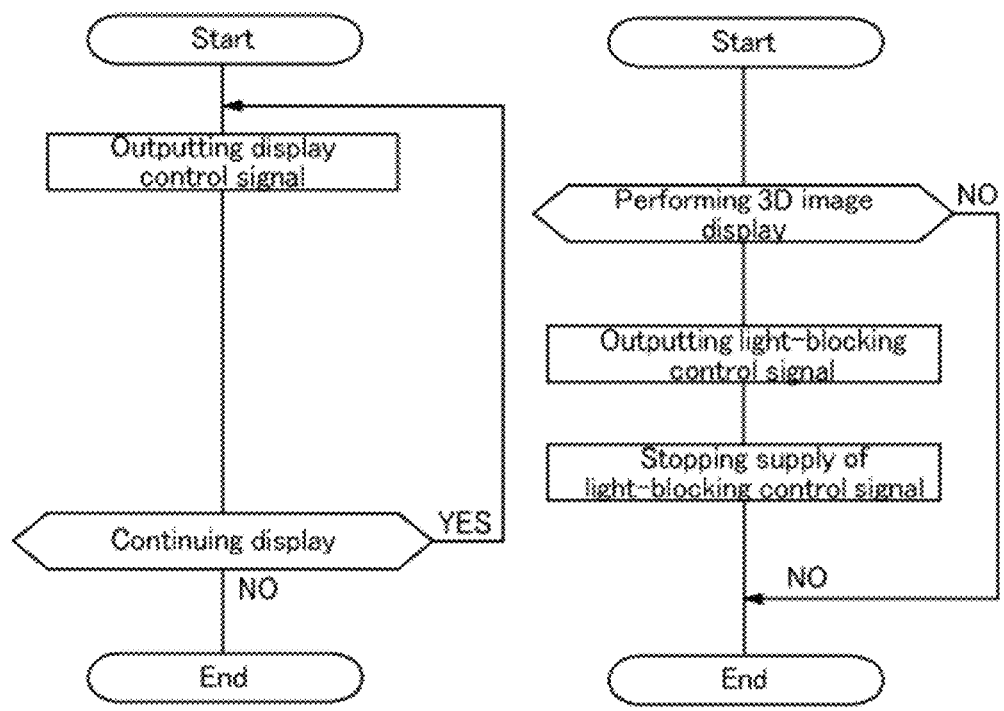
FIG. 4C
FIG. 4D

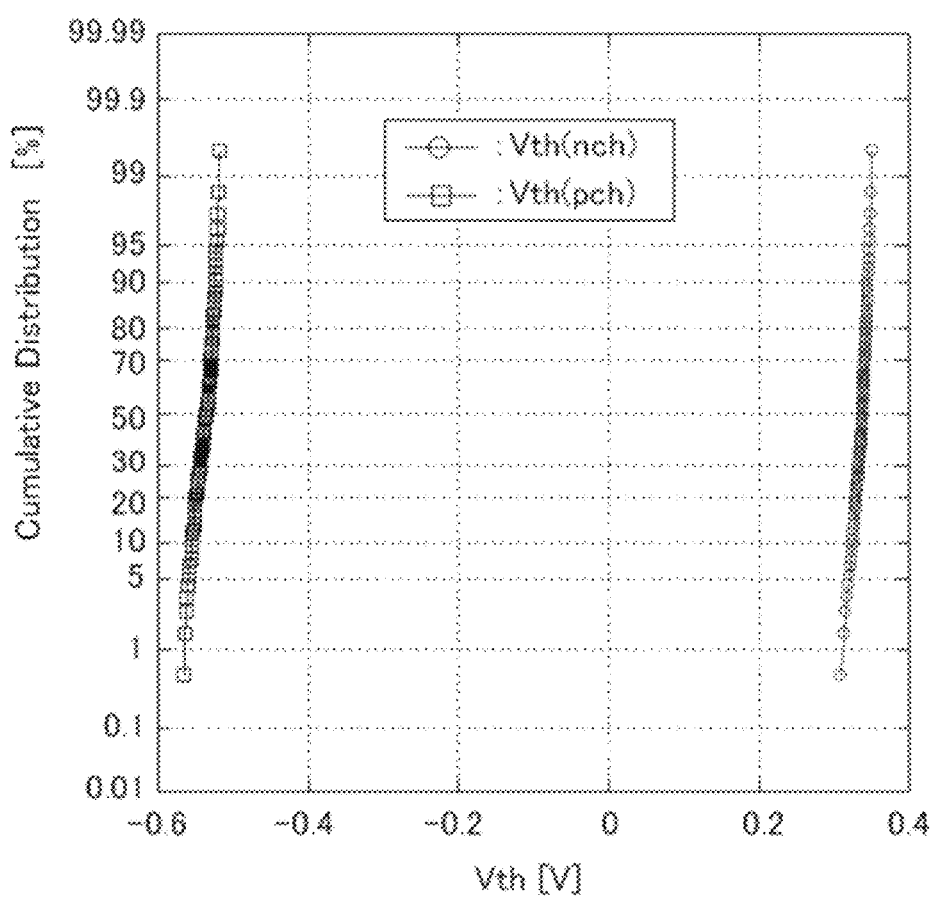

DISPLAY DEVICE

BACKGROUND OF THE INVENTION

1. Field of the Invention

One embodiment of the present invention relates to display devices, particularly to electroluminescent display devices. Another embodiment of the present invention relates to electronic devices including such display devices.

2. Description of the Related Art

Various electronic devices such as cellular phones and television receivers include display devices. Electroluminescent (EL) display devices using electroluminescent elements are attracting attention as display devices for their small thickness and light weight.

An EL element in an EL display device is driven in accordance with the amount of the current flowing through the element. For this reason, each pixel in a display portion is connected to wiring for supplying current (current-supplying line). A current-supplying line is composed of a wire extended from outside a display region. Each pixel includes a transistor serving as a switching element for controlling current supplied to the EL element.

Transistors containing polysilicon (p-Si), which have higher field-effect mobility and better electrical characteristics than those of transistors containing amorphous silicon (a-Si), are suitable for the use as switching elements. Transistors containing p-Si, however, are prone to variations in electrical characteristics such as threshold voltage due to bonding defects at grain boundaries.

Accordingly, a structure in which pixels including transistors containing p-Si includes a circuit for compensating variations between transistors in threshold voltage has been disclosed, for example, in Patent Document 1. Patent Document 1 discloses the structure of a display device in which each pixel includes a light-emitting element and a drive transistor as well as two switching parts and two capacitors. The two switching parts include the first to fifth transistors. In other words, in the display device disclosed in Patent Document 1, one pixel includes six transistors.

REFERENCE

Patent Document

[Patent Document 1] Japanese Published Patent Application No. 2006-259737

SUMMARY OF THE INVENTION

As pixel density is increased for high definition, the size of each pixel is naturally reduced. In this case, however, the area occupied, for example, by a TFT, a source line, and a gate line in each pixel increases, reducing aperture ratio. Therefore, in order to achieve high aperture ratio of each pixel without exceeding predetermined pixel size, circuit components needed for a pixel are required to be laid out efficiently. As the number of circuit components included in one pixel increases, layout area increases, precluding high aperture ratio and/or high definition.

In view of this, one embodiment of the present invention is to provide a high-definition display device.

One embodiment of the present invention is a display device including a pixel area including a plurality of pixels arranged in a matrix and having a horizontal resolution of 350 ppi or more and a color filter layer overlapping with the pixel area. The pixels each include a first transistor whose gate electrode is electrically connected to a scan line, whose one of a source electrode and a drain electrode is electrically connected to a signal line, and whose channel formation region is composed of a single crystal semiconductor; a second transistor whose gate electrode is electrically connected to the other of the source electrode and the drain electrode of the first transistor, whose one of a source electrode and a drain electrode is electrically connected to a current-supplying line, and whose channel formation region is composed of a single crystal semiconductor; and a light-emitting element one electrode of which is electrically connected to the other of the source electrode and the drain electrode of the second transistor and the other electrode of which is electrically connected to a common electrode. The light-emitting element includes at least a first light-emitting layer and a second light-emitting layer that emit lights of different colors.

One embodiment of the present invention is a display device including a pixel area including a plurality of pixels arranged in a matrix and having a horizontal resolution of 350 ppi or more and a color filter layer overlapping with the pixel area. The pixels each include a first transistor whose gate electrode is electrically connected to a scan line, whose one of a source electrode and a drain electrode is electrically connected to a signal line, and whose channel formation region is composed of a single crystal semiconductor; a capacitor one electrode of which is electrically connected to the other of the source electrode and the drain electrode of the first transistor and the other electrode of which is electrically connected to capacity wiring; a second transistor whose gate electrode is electrically connected to the other of the source electrode and the drain electrode of the first transistor and to the one electrode of the capacitor, whose one of a source electrode and a drain electrode is electrically connected to a current-supplying line, and whose channel formation region is composed of a single crystal semiconductor; and a light-emitting element one electrode of which is electrically connected to the other of the source electrode and the drain electrode of the second transistor and the other electrode of which is electrically connected to a common electrode. The light-emitting element includes at least a first light-emitting layer and a second light-emitting layer that emit lights of different colors.

One embodiment of the present invention is a display device including a display panel and a shutter panel placed on a side where the display panel emits light. The display panel includes a pixel area including a plurality of pixels arranged in a matrix and having a horizontal resolution of 350 ppi or more, and a color filter layer overlapping with the pixel area. The pixels each include a first transistor whose gate electrode is electrically connected to a scan line, whose one of a source electrode and a drain electrode is electrically connected to a signal line, and whose channel formation region is composed of a single crystal semiconductor; a second transistor whose gate electrode is electrically connected to the other of the source electrode and the drain electrode of the first transistor, whose one of a source electrode and a drain electrode is electrically connected to a current-supplying line, and whose channel formation region is composed of a single crystal semiconductor; and a light-emitting element one electrode of which is electrically connected to the other of the source electrode and the drain electrode of the second transistor and the other electrode of which is electrically connected to a common electrode. The light-emitting element includes at least a first light-emitting layer and a second light-emitting layer that emit lights of different colors. The shutter panel includes a liquid crystal element and a switching element selecting a transmissive or non-transmissive state of the liquid crystal element.

One embodiment of the present invention is a display device including a display panel and a shutter panel placed on a side where the display panel emits light. The display panel includes a pixel area including a plurality of pixels arranged in a matrix and having a horizontal resolution of 350 ppi or more, and a color filter layer overlapping with the pixel area. The pixels each include a first transistor whose gate electrode is electrically connected to a scan line, whose one of a source electrode and a drain electrode is electrically connected to a signal line, and whose channel formation region is composed of a single crystal semiconductor; a capacitor one electrode of which is electrically connected to the other of the source electrode and the drain electrode of the first transistor and the other electrode of which is electrically connected to capacity wiring; a second transistor whose gate electrode is electrically connected to the other of the source electrode and the drain electrode of the first transistor and to the one electrode of the capacitor, whose one of a source electrode and a drain electrode is electrically connected to a current-supplying line, and whose channel formation region is composed of a single crystal semiconductor; and a light-emitting element one electrode of which is electrically connected to the other of the source electrode and the drain electrode of the second transistor and the other electrode of which is electrically connected to a common electrode. The light-emitting element includes at least a first light-emitting layer and a second light-emitting layer that emit lights of different colors. The shutter panel includes a liquid crystal element and a switching element selecting a transmissive or non-transmissive state of the liquid crystal element.

In the above-described display device, the shutter panel may include a third transistor whose channel formation region is composed of an oxide semiconductor. The third transistor serves as the switching element.

In the above-described display device, colors of lights emitted by the first light-emitting layer and the second light-emitting layer are complementary colors.

With one embodiment of the present invention, a high-definition display device can be provided.

BRIEF DESCRIPTION OF THE DRAWINGS

The patent or application file contains at least one drawing executed in color. Copies of this patent or patent application publication with color drawing will be provided by the Office upon request and payment of the necessary fee.

FIGS. 3A, 3B1, 3B2, and 3C are diagrams illustrating one embodiment of a light-emitting element used in the display device.

FIGS. 4A and 4B are diagrams illustrating one embodiment of the display device, and FIGS. 4C and 4D are flow charts illustrating an operation example.

FIG. 10 is a graph showing variations in Vth value between TFTs fabricated by using the SOI substrate of Example 1.

DETAILED DESCRIPTION OF THE INVENTION

Figure 1A:
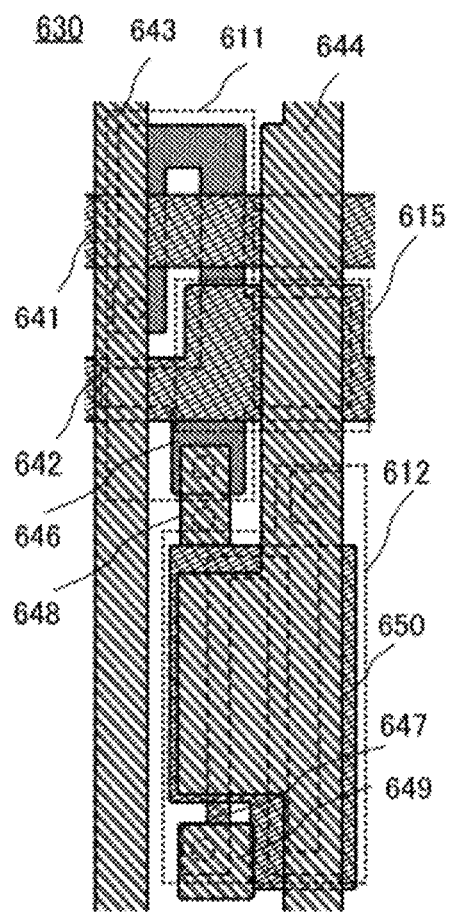
FIGS. 1A and 1B are a plan view and a circuit diagram illustrating one embodiment of a display device.

Embodiments of the present invention will be described below with reference to the drawings. Note that the present invention can be implemented in various different ways. It will be readily appreciated by those skilled in the art that modes of the embodiments can be modified in various ways without departing from the spirit and scope of the present invention. The present invention therefore should not be construed as being limited to the description of the embodiments. Note that in the components of the present invention described below, reference numerals denoting the same portions are used in common in different drawings.

Note that, the size, layer thickness, and region of the objects shown in the drawings and the like of the embodiments are exaggerated for simplicity in some cases. Therefore, the objects are not necessarily in such scales.

Note that, in this specification and the like, "first" to "N-th (N is a natural number)" are ordinal numbers used only for preventing confusion between components, and thus do not limit numbers. Here, a natural number is 1 or more unless otherwise specified.

(Embodiment 1)

An active-matrix display device which is one embodiment of the present invention will be described with reference to FIGS. 1A and 1B and FIGS. 2A and 2B.

A light-emitting element (also called light-emitting display element) is used as a display element provided in a display panel included in the display device. Light-emitting elements include elements whose luminance is controlled by current or voltage, such as EL elements.

Figure 1B:
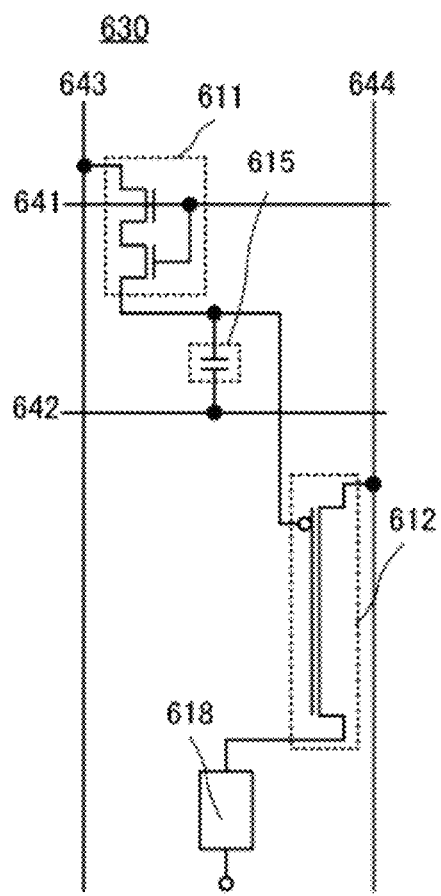
Figure 2A:
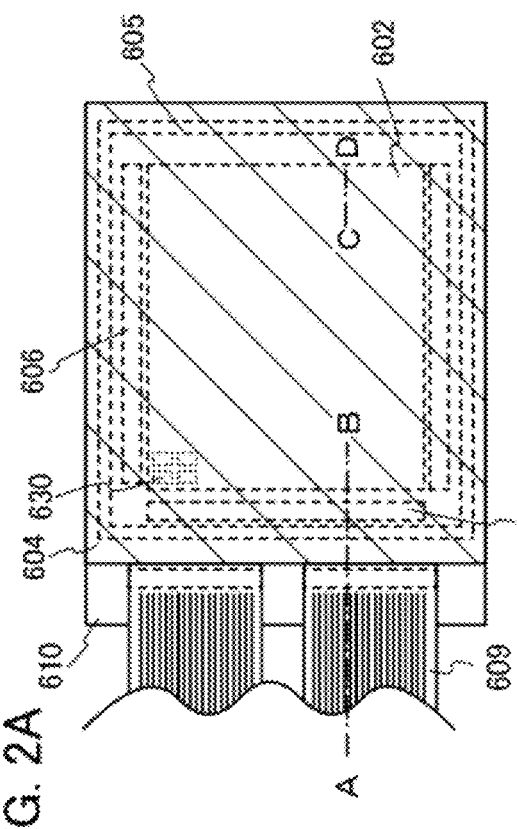
FIGS. 2A and 2B are a plan view and a cross-sectional view illustrating one embodiment of the display device.
Figure 2B:
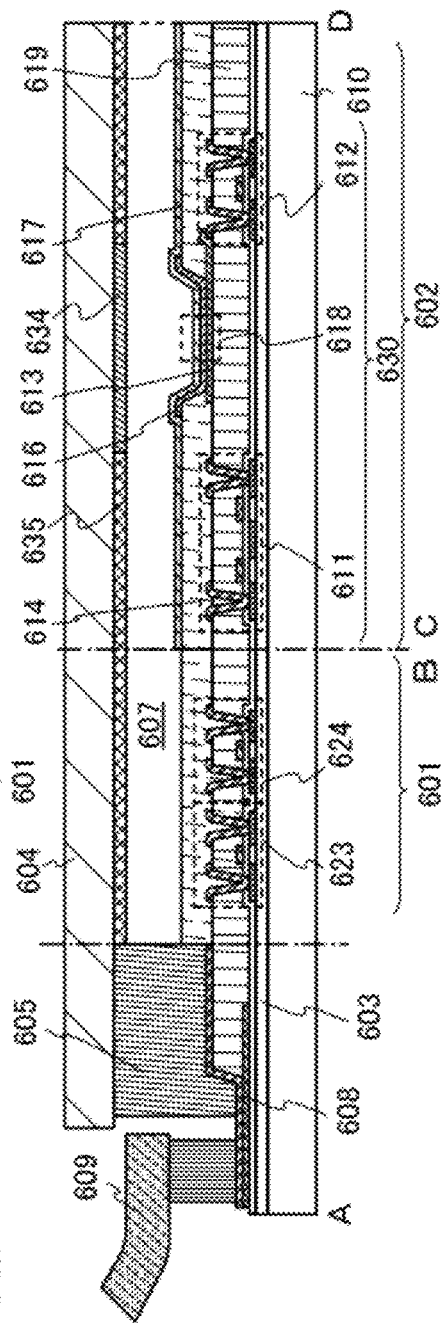

FIGS. 1A and 1B and FIGS. 2A and 2B show an example of the structure of a display device using an organic EL element as a display element. FIG. 2A is a plan view of a display device. FIG. 2B is a cross-sectional view along line A-B and C-D in FIG. 2A. An element substrate 610 adheres to a sealing substrate 604 by a sealant 605. The display device according to this embodiment includes a driver circuit area (a source driver circuit 601 and a gate driver circuit 606) and a pixel area 602 including a plurality of pixels 630.

Wiring 608 is wiring for transmitting signals to be input to the source driver circuit 601 and the gate driver circuit 606 and receiving signals such as a video signal, a clock signal, a start signal, and a reset signal from an FPC (flexible printed circuit) 609 serving as an external input terminal. Although only the FPC is illustrated here, a printed wiring board (PWB) may be attached to the FPC. The display device in this specification includes not only a display device body but also a display device to which an FPC or a PWB is attached.

Note that FIG. 1A is a plan view of the pixel 630 included in the pixel area 602, and FIG. 1B is an equivalent circuit diagram of the pixel 630.

The pixel 630 includes a transistor 611, a transistor 612, and a light-emitting element 618 emitting white light. A gate electrode of the transistor 611 is electrically connected to a scan line 641. One of a source electrode and a drain electrode of the transistor 611 is electrically connected to a signal line 643. A channel formation region of the transistor 611 is composed of a single crystal semiconductor. A gate electrode of the transistor 612 is electrically connected to the other of the source electrode and the drain electrode of the transistor 611. One of a source electrode and a drain electrode of the transistor 612 is electrically connected to a current-supplying line 644. A channel formation region of the transistor 612 is composed of a single crystal semiconductor. One electrode of the light-emitting element 618 is electrically connected to the other of the source electrode and the drain electrode of the transistor 612, and the other electrode of the light-emitting element 618 is electrically connected to a common electrode.

The pixel in this embodiment includes a capacitor 615 one electrode of which is electrically connected to the source or drain electrode of the transistor 611, and the other electrode of which is electrically connected to capacity wiring 642. In this embodiment, the transistor 611 is an n-channel transistor, while the transistor 612 is a p-channel transistor, as an example.

The transistor 611 serving as a switching transistor includes the scan line 641 serving as the gate electrode, a semiconductor layer 646 containing the channel formation region composed of a single crystal semiconductor, and the signal line 643 serving as the source or drain electrode. The transistor 612 serving as a current-controlling transistor includes a conductive layer 650 serving as the gate electrode, a semiconductor layer 647 containing the channel formation region composed of a single crystal semiconductor, and a conductive layer 649 serving as the source or drain electrode. The transistor 611 and the transistor 612 are electrically connected to each other by a conductive layer 648 in contact with the semiconductor layer 646 and the conductive layer 650. The conductive layer 648 serves as the source or drain electrode of the transistor 611.

The channel formation regions in the semiconductor layers 646 and 647 are composed of a single crystal semiconductor. When the channel formation region is composed of a single crystal semiconductor, a reduction in transistor size can be achieved, leading to higher-definition pixels in the display portion.

Typical examples of a single crystal semiconductor substrate for the semiconductor layers 646 and 647 include a single crystal semiconductor substrate composed of elements that belong to Group 14, such as a single crystal silicon substrate, a single crystal germanium substrate, and a single crystal silicon germanium substrate, and a compound semiconductor substrate, such as an SiC substrate, a sapphire substrate, and a GaN substrate. Preferred one is a silicon on insulator (SOI) substrate in which a single crystal semiconductor layer is provided on an insulating surface.

An SOI substrate can be fabricated by the following method: after oxygen ions are implanted in a mirror-polished wafer, the wafer is heated at high temperatures to form an oxidized layer at a predetermined depth from a surface of the wafer and eliminate defects generated in a surface layer. Alternatively, an SOI substrate can be fabricated by the method in which the semiconductor substrate is separated by utilizing the growth of microvoids formed by hydrogen ion irradiation (this growth is caused by heat treatment). Alternatively, an SOI substrate can be fabricated by the method in which a single crystal semiconductor layer is formed on an insulating surface by crystal growth.

In this embodiment, ions are added to a single crystal semiconductor substrate from one side to form a fragile layer at a predetermined depth from one surface of the single crystal semiconductor substrate, and an insulating layer 603 is formed either over one surface of the single crystal semiconductor substrate or over the element substrate 610. A crack is caused in the fragile layer while the insulating layer 603 is sandwiched between the single crystal semiconductor substrate and the element substrate 610. Heat treatment for separating the single crystal semiconductor substrate at the fragile layer is performed to leave a single crystal semiconductor layer over the element substrate 610. The single crystal semiconductor layer serves as the semiconductor layers 646 and 647. Note that the details of a method for fabricating the SOI substrate and the crystallinity of the single crystal semiconductor layer will be described in Example 1.

An isolation region may be formed in the semiconductor substrate to form the transistors 611 and 612 by using isolated semiconductor regions.

The use of the single crystal semiconductor as a channel formation region reduces variations between transistors in electrical characteristics such as threshold voltage due to bonding defects at grain boundaries. Hence, in the display device according to one embodiment of the present invention, the light-emitting elements are allowed to operate normally without placing a circuit for compensating threshold voltage in each pixel. The number of circuit elements per pixel can therefore be reduced, increasing the flexibility in layout. Thus, a high-definition display device can be achieved. For example, a display device having a matrix of a plurality of pixels, specifically 350 pixels or more per one inch (i.e., the horizontal resolution is 350 pixels per inch (ppi) or more), more preferably 400 or more pixels per one inch (i.e., the horizontal resolution is 400 ppi or more) can be achieved.

Moreover, a transistor whose channel formation region is composed of a single crystal semiconductor can be downsized while keeping high current drive capability. The use of the downsized transistor leads to a reduction in the area of the circuit area that does not affect display operation, resulting in an increase in the area of a region of the display portion where an image is displayed and a reduction in the frame size of the display device.

In this embodiment, the scan line 641, the capacity wiring 642, and the conductive layer 650 are formed in the same step, while the signal line 643, the current-supplying line 644, the conductive layer 648, and the conductive layer 649 are formed in the same step.

A color filter layer 634 is provided in accordance with the color of the pixel so as to overlap with the light-emitting element 618.

The display device can be a multicolor display device when pixels of at least 2 colors, e.g., blue (B), green (G), and red (R), are provided in the pixel area 602. Alternatively, the display device may be a monochrome display device.

A color filter layer is provided in accordance with the color of the pixel. For example, a blue (B) pixel, a green (G) pixel, and a red (R) pixel have a blue color filter layer, a green color filter layer, and a red color filter layer, respectively.

Each light-emitting element 618 has a reflective electrode 613, an EL layer 616, and a light-transmitting electrode 617. One of the reflective electrode 613 and the light-transmitting electrode 617 is used as an anode, and the other is used as a cathode.

The light-emitting element 618 is electrically connected to the transistor 612 by bringing the reflective electrode 613 into contact with the conductive layer 649.

The EL layer 616 is a stack of at least the first light-emitting layer and the second light-emitting layer which emit lights of different colors. For example, the EL layer 616 is composed of a stack of the first light-emitting layer and the second light-emitting layer which emit lights of different colors. In this case, the light-emitting element can emit white light when the colors of lights emitted by these light-emitting layers are complementary colors. For another example, the EL layer 616 is composed of a stack of the first light-emitting layer, the second light-emitting layer, and the third light-emitting layer which emit lights of different colors. In this case, the light-emitting element can emit white light when the colors of lights emitted by these light-emitting layers are red, green, and blue. The display device can be a full-color display device when light-emitting elements capable of emitting white light in this way is overlapped with the red (R), green (G), and blue (B) color filter layers.

The EL layer 616 can be a stack, for example, of a hole injection layer, a hole transport layer, an electron transport layer, and an electron injection layer as well as a light-emitting layer. Alternatively, the EL layer may be a stack of a plurality of EL layers, in which stack a charge generating layer may be provided between one EL layer and another EL layer. The light-emitting element can emit, for example, white light when a stack of a plurality of light-emitting layers is provided between the anode and the cathode.

Note that a light-transmitting conductive layer may be provided between the reflective electrode 613 and the EL layer 616. The light-transmitting conductive layer has a function of adjusting the optical distance between the reflective electrode 613 and the light-transmitting electrode 617 in each pixel. By enhancing a desired spectrum by a micro cavity in each light-emitting element, a display panel with high color purity can be achieved.

The EL layer 616 is composed of a continuous film without selectively depositing the EL layers 616 according to each color by a metal mask, preventing a reduction in yield due to the use of a metal mask and complicated process. Thus, a high-definition display panel having high color reproducibility can be achieved.

The color filter layer 634 overlapping with the light-emitting element 618 can be processed into a desired shape by a photolithography process and an etching process. Thus, a finely patterned color filter layer can be formed with high controllability, leading to a high-definition display device.

A light-blocking layer 635 may be provided so as to overlap with a region between the pixels or the driver circuit area. The light-blocking layer 635 is made of a light-blocking material that reflects or absorbs light. For example, the light-blocking layer 635 can be made of a black organic resin that can be made by mixing a black resin of a pigment material, carbon black, titanium black, or the like into a resin material such as photosensitive or non-photosensitive polyimide. Alternatively, the light-blocking layer 635 can be a light-blocking metal film that may be made, for example, of chromium, molybdenum, nickel, titanium, cobalt, copper, tungsten, or aluminum.

There is no particular limitation on the method for forming the light-blocking layer 635, and a dry method such as an evaporation method, a sputtering method, or a CVD method or a wet method such as spin coating, dip coating, spray coating, or a droplet discharging method (such as an inkjet method, screen printing, or offset printing) may be used depending on the material. Optionally, an etching method (dry etching or wet etching) may be employed to form a desired pattern.

A light-blocking layer 635, which can prevent light from leaking into the adjacent pixel, enables high-contrast and higher-definition images to be displayed.

Note that in the source driver circuit 601, a CMOS circuit which is the combination of an n-channel transistor 623 and a p-channel transistor 624 is formed. Alternatively, the driver circuit may include various CMOS circuits, PMOS circuits, or NMOS circuits which include transistors.

Application of digital system to the driving method complicates the circuit configuration of the driver circuit compared to application of analog system, causing the need for increasing transistor integration. Transistors 623 and 624 used in the driver circuit in this embodiment are downsized transistors whose channel formation regions are composed of a single crystal semiconductor and which have high current drive capability and can operate at high speed.

In this embodiment, the source driver circuit and the gate driver circuit are formed over the substrate as an example, but this is not necessarily achieved. A part or all of the source driver circuit and gate driver circuit can be formed outside the substrate.

Note that an insulator 614 is formed to cover the end portions of the reflective electrode 613. Here, the insulator 614 is a positive photosensitive acrylic resin film.

The insulator 614 preferably has a curved surface with curvature at an upper end portion or a lower end portion thereof in order to obtain favorable coverage. For example, in the case of using a positive photosensitive acrylic resin as a material for the insulator 614, the insulator 614 preferably has a curved surface with a curvature radius (0.2 μm to 3 μm) only at the upper end portion. The insulator 614 can be made of either a negative photosensitive material that becomes insoluble in an etchant by light irradiation or a positive photosensitive material that becomes soluble in an etchant by light irradiation.

Further, a light-emitting element 618 is provided in a space 607 surrounded by the element substrate 610, the sealing substrate 604, and the sealant 605 by pasting the sealing substrate 604 and the element substrate 610 using the sealant 605. The space 607 may be filled with filler, and may be filled with an inert gas (such as nitrogen or argon), an organic resin, the sealant 605, or the like. A material containing a hygroscopic substance may be used for the organic resin and the sealant 605.

An epoxy based resin is preferably used for the sealant 605. It is desirable that materials used for the sealant 605 do not transmit moisture or oxygen as much as possible. As the sealing substrate 604, a plastic substrate formed of FRP (fiberglass-reinforced plastics), PVF (polyvinyl fluoride), polyester, or acrylic can be used instead of a glass substrate or a quartz substrate.

As in this embodiment, the insulating layer 603 serving as a base film may be provided between the element substrate 610 and the semiconductor layer of the transistor. The insulating layer 603 also serves as a protective layer or a sealing film, which protects the element from external contaminants such as water, for example, from the element substrate 610. By providing the insulating layer 603, deterioration of the light-emitting element can be suppressed; thus, the durability and lifetime of the display device can be improved.

A single layer or a stack of a nitride film and a nitride oxide film can be used as the insulating layer 603. Specifically, the inorganic insulator can be formed using silicon oxide, silicon nitride, silicon oxynitride, aluminum oxide, aluminum nitride, aluminum oxynitride, or the like by a CVD method, a sputtering method, or the like depending on the material. It is preferable that the insulating layer 603 be formed using silicon nitride by a CVD method. The thickness of the insulating layer 603 may be greater than or equal to 100 nm and less than or equal to 1 μm. Alternatively, an aluminum oxide film, a DLC film, a carbon film containing nitrogen, or a film containing zinc sulfide and silicon oxide ($ZnS.SiO_2$ film) may be used as the insulating layer 603.

Alternatively, a thin glass substrate can be used as the insulating layer 603. For example, a glass substrate with a thickness greater than or equal to 30 μm and less than or equal to 100 μm can be used.

A metal plate may be provided on a bottom surface of the element substrate 610 (a surface opposed to a surface over which the light-emitting element is provided). The metal plate can be used instead of the element substrate 610 when the insulating layer 603 is provided. Although there is no particular limitation on the thickness of the metal plate, a metal plate with a thickness greater than or equal to 10 μm and less than or equal to 200 μm is preferably used, in which case a reduction in the weight of the display device can be achieved. Further, although there is no particular limitation on the material of the metal plate, a metal such as aluminum, copper, or nickel, a metal alloy such as an aluminum alloy or stainless steel, or the like can be preferably used.

The metal plate and the element substrate 610 can be bonded to each other with an adhesive layer. As the adhesive layer, a visible light curable adhesive, an ultraviolet curable adhesive, or a thermosetting adhesive can be used. Examples of materials for such adhesives include an epoxy resin, an acrylic resin, a silicone resin, and a phenol resin. A moisture-absorbing substance serving as a desiccant may be contained in the adhesive layer.

In this embodiment, there is no particular limitation on the structure of the transistors 611, 612, 623, and 624 which can be used in the display device; for example, a staggered type transistor or a planar type transistor having a top-gate structure or a bottom-gate structure can be used. The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned over and below a channel region with a gate insulating layer therebetween.

The gate electrode and the wiring layers (e.g., the scan line 641, the capacity wiring 642, and the conductive layer 650) formed in the same step as the gate electrode can be a single layer or a stack of a metal material such as molybdenum, titanium, chromium, tantalum, tungsten, aluminum, copper, neodymium, or scandium, or an alloy material containing any of these materials as its main component.

Examples of preferable two-layer structures of the gate electrode include a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. A preferable three-layer structure is a three-layer structure in which a tungsten layer or a tungsten nitride layer, an alloy of aluminum and silicon or an alloy of aluminum and titanium, and a titanium nitride layer or a titanium layer are stacked.

The gate insulating layer can be a single layer or a stack using a silicon oxide layer, a silicon nitride layer, a silicon oxynitride layer, and/or a silicon nitride oxide layer by a plasma CVD method, a sputtering method, or the like. Alternatively, a silicon oxide layer formed by a CVD method using an organosilane gas can be used as the gate insulating layer. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

Examples of a material for a conductive layer serving as a source or drain electrode and wiring layers formed in the same step (e.g., the signal line 643, the current-supplying line 644, the conductive layer 648, and the conductive layer 649) include an element selected from, Al, Cr, Ta, Ti, Mo, and W; an alloy containing any of these elements; and an alloy containing a combination of any of these elements. In the case where heat treatment is performed, a conductive film preferably has heat resistance high enough to withstand the heat treatment. Since the use of Al alone brings disadvantages such as low heat resistance and a tendency for corrosion, aluminum is used in combination with a conductive material having heat resistance. As the conductive material having heat resistance, which is combined with Al, it is possible to use an element selected from titanium (Ti), tantalum (Ta), tungsten (W), molybdenum (Mo), chromium (Cr), neodymium (Nd), and scandium (Sc), an alloy containing any of these elements as its component, an alloy containing a combination of any of these elements, or a nitride containing any of these elements as its component.

An inorganic insulating film or an organic insulating film formed by a dry method or a wet method can be used for an insulating film 619 which covers the transistors 611, 612, 623, and 624. For example, a silicon nitride film, a silicon oxide film, a silicon oxynitride film, an aluminum oxide film, a tantalum oxide film, or a gallium oxide film which is formed by a CVD method, a sputtering method, or the like can be used. Alternatively, an organic material such as polyimide, acrylic, benzocyclobutene-based resin, polyamide, or an epoxy resin can be used. In addition to the above organic materials, a low-dielectric constant material (a low-k material), a siloxane-based resin, PSG (phosphosilicate glass), BPSG (borophosphosilicate glass), or the like can be used.

Note that the siloxane-based resin corresponds to a resin including a Si—O—Si bond formed using a siloxane-based material as a starting material. The siloxane-based resin may include, as a substituent, an organic group (e.g., an alkyl group or an aryl group) or a fluoro group. The organic group may include a fluoro group. A siloxane-based resin is applied by a coating method and baked; thus, the insulating film 419 can be formed.

Note that the insulating film 619 may be formed by stacking a plurality of insulating films made of any of the above-described materials. For example, a structure may be employed in which an organic resin film is stacked over an inorganic insulating film.

As a display method in the pixel area, a progressive method, an interlace method, or the like can be employed. Further, color elements controlled in a pixel when a color image is displayed are not limited to three colors: R, G and B (R, G, and B correspond to red, green, and blue). For example, R, G, B, and W (W corresponds to white); or R, G, B, and one or more of colors selected from yellow, cyan, magenta, and the like can be used. Note that the size of display regions may be different between dots of color elements. This embodiment is not limited to a display panel displaying color images but can also be applied to a display panel displaying monochrome images.

In one embodiment of the present invention, a high-definition display device can be provided in the above-stated manner.

The structures and methods in this embodiment can be used in appropriate combination with any of the structures and methods in the other embodiments.

(Embodiment 2)

In this embodiment, an example of an element structure of a light-emitting element exhibiting organic EL emission, which is used in a display device according to one embodiment of the present invention, will be described.

A light-emitting element shown in FIG. 3A includes the reflective electrode 613, the EL layer 616 over the reflective electrode 613, and the light-transmitting electrode 617 over the EL layer 616.

The EL layer 616 includes at least a light-emitting layer containing a light-emitting organic compound. In addition, the EL layer 616 can have a layered structure in which a layer containing a substance having a high electron transport property, a layer containing a substance having a high hole transport property, a layer containing a substance having a high electron injection property, a layer containing a substance having a high hole injection property, a layer containing a bipolar substance (a substance having a high electron transport property and a high hole transport property), and the like are combined as appropriate. In this embodiment, a hole injection layer 701, a hole transport layer 702, a light-emitting layer 703, an electron transport layer 704, and an electron injection layer 705 are stacked in this order from the reflective electrode 613 side in the EL layer 616.

A structure example of the light-emitting element shown in FIG. 3A and a method for fabricating the same will be described.

First, the reflective electrode 613 is formed. The reflective electrode 613 is provided on the opposite side to the side where light is extracted and is composed of a reflective material. As the reflective material, a metal material such as aluminum, gold, platinum, silver, nickel, tungsten, chromium, molybdenum, iron, cobalt, copper, or palladium can be used. In addition, any of the following can be used: alloys containing aluminum (aluminum alloys) such as an alloy of aluminum and titanium, an alloy of aluminum and nickel, and an alloy of aluminum and neodymium; and an alloy containing silver such as an alloy of silver and copper. An alloy of silver and copper is preferable because of its high heat resistance. Further, a metal film or a metal oxide film is stacked on an aluminum alloy film, whereby oxidation of the aluminum alloy film can be prevented. Examples of a material for the metal film or the metal oxide film include titanium, and titanium oxide. The above materials are preferable because they are present in large amounts in the Earth's crust and inexpensive to achieve a reduction in manufacturing cost of a light-emitting element.

In this embodiment, the reflective electrode 613 is used as the anode of a light-emitting element, as an example. However, this does not necessarily apply to the embodiments of the present invention.

Next, the EL layer 616 is formed over the reflective electrode 613. In this embodiment, the EL layer 616 includes the hole injection layer 701, the hole transport layer 702, the light-emitting layer 703, the electron transport layer 704, and the electron injection layer 705.

The hole injection layer 701 is a layer containing a substance having a high hole injection property. As the substance having a high hole injection property, for example, a metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. A phthalocyanine-based compound such as phthalocyanine (abbreviation: $H_2Pc$) or copper(II) phthalocyanine (abbreviation: CuPc) may be used.

Further, any of the following aromatic amine compounds which are low molecular organic compounds can be used: 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N''-phenylamino]phenyl}1-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)-amino]-9-phenylcarbazole (abbreviation: PCzPCN1).

Still alternatively, any of high molecular compounds (e.g., oligomers, dendrimers, or polymers) may be used. Examples of the high-molecular compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD). A high molecular compound to which acid is added, such as poly(3,4-ethylene dioxythiophene)/poly(styrene sulfonic acid) (PEDOT/PSS) or polyaniline/poly(styrenesulfonic acid) (PAni/PSS), may be used.

In particular, for the hole injection layer 701, a composite material in which an organic compound having a high hole transport property is mixed with an acceptor substance is preferably used. With the use of the composite material in which an organic compound having a high hole transport property is mixed with an acceptor substance, excellent hole injection from the reflective electrode 613 can be obtained, which results in a reduction in driving voltage of the light-emitting element. Such a composite material can be formed by co-evaporation of a substance having a high hole transport property and an acceptor substance. The hole injection layer 701 is formed using the composite material, whereby hole injection from the reflective electrode 613 to the EL layer 616 is facilitated.

As the organic compound for the composite material, any of a variety of compounds such as aromatic amine compounds, carbazole derivatives, aromatic hydrocarbons, and high molecular compounds (e.g., oligomers, dendrimers, and polymers) can be used. The organic compound used for the composite material is preferably an organic compound having a high hole transport property. Specifically, a substance having a hole mobility of $10^{-6}$ $cm^2/Vs$ or higher is preferably used. Note that any other substance may be used as long as the hole transport property thereof is higher than the electron transport property thereof. Specific examples of the organic compound that can be used for the composite material are given below.

Examples of the organic compound that can be used for the composite material include aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP), and carbazole compounds such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)-phenyl]-2,3,5,6-tetraphenylbenzene.

Further, any of the following aromatic hydrocarbon compounds may be used: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)

anthracene (abbreviation: DPPA), 2-tert-butyl-9,10-bis(4-phenylphenyl)anthracene (abbreviation: t-BuDBA), 9,10-di (2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis [2-(1-naphthyl)phenyl]anthracene, 2,3,6,7-tetramethyl-9,10-di(1-naphthyl)anthracene, and the like.

Furthermore, any of the following aromatic hydrocarbon compounds may be used: 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Examples of the electron acceptor include organic compounds such as 7,7,8,8-tetracyano-2,3,5,6-tetrafluoroquinodimethane (abbreviation: $F_4$-TCNQ) and chloranil; and transition metal oxides. Other examples include oxides of metals belonging to Groups 4 to 8 in the periodic table. Specifically, vanadium oxide, niobium oxide, tantalum oxide, chromium oxide, molybdenum oxide, tungsten oxide, manganese oxide, and rhenium oxide are preferable because of their high electron accepting property. Among these, molybdenum oxide is particularly preferable because it is stable in the air, has a low hygroscopic property, and is easily handled.

The composite material may be formed using the above electron acceptor and the above high molecular compound such as PVK, PVTPA, PTPDMA, or Poly-TPD and used for the hole injection layer 701.

The hole transport layer 702 is a layer containing a substance having a high hole transport property. As the substance having a high hole transport property, any of the following aromatic amine compounds can be used, for example: NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances given here are mainly ones that have a hole mobility of $10^{-6}$ cm$^2$/Vs or higher. Note that any other substance may be used as long as the hole transport property thereof is higher than the electron transport property thereof. Note that the layer containing a substance having a high hole transport property is not limited to a single layer and may be formed of a stack of two or more layers containing any of the above substances.

For the hole transport layer 702, a carbazole derivative such as CBP, CzPA, or PCzPA or an anthracene derivative such as t-BuDNA, DNA, or DPAnth may be used.

For the hole transport layer 702, a high molecular compound such as PVK, PVTPA, PTPDMA, or Poly-TPD may be used.

The light-emitting layer 703 is a layer containing a light-emitting organic compound. As the light-emitting organic compound, for example, a fluorescent compound which exhibits fluorescence or a phosphorescent compound which exhibits phosphorescence can be used.

The fluorescent compounds that can be used for the light-emitting layer 703 will be given. Examples of a material for blue light emission include N,N'-bis[4-(9H-carbazol-9-yl) phenyl]-N,N'-diphenylstilbene-4,4'-diamine (abbreviation: YGA2S), 4-(9H-carbazol-9-yl)-4'-(10-phenyl-9-anthryl) triphenylamine (abbreviation: YGAPA), and 4-(10-phenyl-9-anthryl)-4'-(9-phenyl-9H-carbazol-3-yl)triphenylamine (abbreviation: PCBAPA). Further, examples of a material for green light emission include N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), and N,N,9-triphenylanthracen-9-amine (abbreviation: DPhAPhA). Examples of a material for yellow light emission include rubrene and 5,12-bis(1,1'-biphenyl-4-yl)-6,11-diphenyltetracene (abbreviation: BPT). Examples of a material for red light emission include organometallic complexes such as bis[2-(2'-benzo[4,5-α]thienyl)pyridinato-N, C$^3$]iridium(III) acetylacetonate (abbreviation: Ir(btp)$_2$(acac)), bis(1-phenylisoquinolinato-N, C$^{2'}$)iridium(III) acetylacetonate (abbreviation: Ir(piq)$_2$ (acac)), (acetylacetonato)bis[2,3-bis(4-fluorophenyl)quinoxalinato]iridium(III) (abbreviation: Ir(Fdpq)$_2$(acac)), and 2,3,7,8,12,13,17,18-octaethyl-21H,23H-porphyrin platinum (II) (abbreviation: PtOEP). Examples of a material for red light emission include N,N,N',N'-tetrakis(4-methylphenyl) tetracene-5,11-diamine (abbreviation: p-mPhTD), and 7,14-diphenyl-N,N,N',N'-tetrakis(4-methylphenyl)acenaphtho[1,2-α]fluoranthene-3,10-diamine (abbreviation: p-mPhAFD).

The phosphorescent compounds that can be used for the light-emitting layer 703 will be given. Examples of a material for blue light emission are include bis[2-(4',6'-difluorophenyl)pyridinato-N, C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N, C2'}iridium(III) picolinate (abbreviation: Ir(CF$_3$ppy)$_2$(pic)), and bis[2-(4',6'-difluorophenyl)pyridinato-N, C$^{2'}$]iridium (III) acetylacetonate (abbreviation: FIr(acac)). Examples of a material for green light emission include tris(2-phenylpyridinato-N, C$^{2'}$)iridium(III) (abbreviation: Ir(ppy)$_3$), bis(2-phenylpyridinato-N, C$^{2'}$)iridium(III)acetylacetonate (abbreviation: Ir(ppy)$_2$(acac)), bis(1,2-diphenyl-1H-benzimidazolato) iridium(III)acetylacetonate (abbreviation: Ir(pbi)$_2$(acac)), bis (benzo[h]quinolinato)iridium(III)acetylacetonate (abbreviation: Ir(bzq)$_2$(acac)), and tris(benzo[h]quinolinato) iridium(III) (abbreviation: Ir(bzq)$_3$). Examples of a material for yellow light emission include bis(2,4-diphenyl-1,3-oxazolato-N,C$^{2'}$)iridium(III)acetylacetonate (abbreviation: Ir(dpo)$_2$(acac)), bis[2-(4'-perfluorophenylphenyl)pyridinato] iridium(III)acetylacetonate (abbreviation: Ir(p-PF-ph)$_2$ (acac)), bis(2-phenylbenzothiazolato-N, C$^{2'}$)iridium(III) acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$ (acac)), and (acetylacetonato)bis{2-(4-methoxyphenyl)-3,5-dimethylpyrazinato}iridium(III) (abbreviation: Ir(dmmoppr)$_2$ (acac)). Examples of a material for orange light emission include tris(2-phenylquinolinato-N,C$^{2'}$)iridium(III) (abbreviation: Ir(pq)$_3$), bis(2-phenylquinolinato-N, C$^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), and (acetylacetonato)bis(5-isopropyl-3-methyl-2-phenylpyrazinato)iridium(III) (abbreviation: Ir(mppr-iPr)$_2$(acac)). Examples of a material for red light emission include organometallic complexes such as bis[2-(2'-benzo[4,5-α]thienyl)pyridinato-N, C$^3$]iridium(III)acetylacetonate (abbreviation: Ir(btp)$_2$ (acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium(III) (abbreviation: Ir(tppr)$_2$(dpm)), and 2,3,7,8,12,13,17,18-octaethyl-21H,23H-porphyrinplatinum(II) (abbreviation: PtOEP). Further, rare-earth metal complexes, such as tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)), exhibit light emission from rare-earth metal ions (electron transition between different multiplicities), and thus can be used as phosphorescent compounds.

Note that the light-emitting layer 703 may have a structure in which the above light-emitting organic compound (a guest material) is dispersed in another substance (a host material). As a host material, a variety of kinds of materials can be used, and it is preferable to use a substance which has a lowest unoccupied molecular orbital level (LUMO level) higher than that of the light-emitting material and has a highest occupied molecular orbital level (HOMO level) lower than that of the light-emitting material.

Specific examples of the host material include metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), and bathocuproine (abbreviation: BCP); condensed aromatic compounds such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), 9,10-diphenylanthracene (abbreviation: DPAnth), and 6,12-dimethoxy-5,11-diphenylchrysene; and aromatic amine compounds such as N,N-dipheyl-9-[4-(10-phenyl-9-anthryl)phenyl]-9H-carbazol-3-amine (abbreviation: CzAlPA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, and BSPB.

As the host material, plural kinds of materials can be used. For example, in order to suppress crystallization, a substance such as rubrene which suppresses crystallization may be further added. In addition, NPB, Alq, or the like may be further added in order to efficiently transfer energy to a guest material.

When a structure in which a guest material is dispersed in a host material is employed, crystallization of the light-emitting layer 703 can be suppressed. Further, concentration quenching due to high concentration of the guest material can be suppressed.

For the light-emitting layer 703, a high molecular compound can be used. Specifically, a material for blue light emission, a material for green light emission, and a material for orange to red light emission are given. Examples of a material for blue light emission include poly(9,9-dioctylfluorene-2,7-diyl) (abbreviation: PFO), poly[(9,9-dioctylfluorene-2,7-diyl-co-(2,5-dimethoxybenzene-1,4-diyl)] (abbreviation: PF-DMOP), and poly{(9,9-dioctylfluorene-2,7-diyl)-co-[N,N'-di-(p-butylphenyl)-1,4-diaminobenzene]} (abbreviation: TAB-PFH). Examples of a material for green light emission include poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), and poly[(9,9-dioctyl-2,7-divinylenfluorenylene)-alt-co-(2-methoxy-5-(2-ethylhexyloxy)-1, 4-phenylene)]. Examples of a material for orange to red light emission include poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-d]hexyl-2,7-bis(1-cyanovinylene)fluorenylene]-alt-co-[2,5-bis(N,N'-diphenyl amino)-1,4-phenylene]}, and poly{[2-methoxy-5-(2-ethylhexyloxy)-1,4-b is(1-cyanovinylenephenylene)]-alt-co-[2,5-bis(N,N'-diphenylamino)-1,4-phenylene]} (abbreviation: CN-PPV-DPD).

Note that the light-emitting layer 703 may have a layered structure of two or more layers. When the light-emitting layer 703 has a layered structure of two or more layers and the kinds of light-emitting substances for light-emitting layers vary, a variety of emission colors can be obtained. In addition, a plurality of light-emitting layers is stacked and a plurality of light-emitting substances of different colors is used as the light-emitting substances contained in the light-emitting layers, whereby light emission having a broad spectrum or white light emission can also be obtained. In particular, for a display device in which high luminance is required, a structure in which light-emitting layers are stacked is preferable.

For example, the light-emitting layer 703 is composed of a stack of the first light-emitting layer and the second light-emitting layer which emit lights of different colors. In this case, the light-emitting element can emit white light when the color of light emitted by one of these light-emitting layers is the complementary color of the color of light emitted by the other. For another example, the light-emitting layer 703 is composed of a stack of the first light-emitting layer, the second light-emitting layer, and the third light-emitting layer which emit lights of different color. In this case, the light-emitting layer 703 can emit white light when the colors of lights emitted by these light-emitting layers are red, green, and blue. The display device according to Embodiment 1 can be a full-color display device when it uses a light-emitting element capable of emitting white light in this way and the light-emitting elements are overlapped with the red (R), green (G), and blue (B) color filter layers.

The electron transport layer 704 is a layer containing a substance having a high electron transport property. As the substance having a high electron transport property, any of the following can be used, for example: a metal complex having a quinoline skeleton or a benzoquinoline skeleton, such as tris(8-quinolinolato)aluminum (abbreviation: Alq), tris(4- methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq). Alternatively, a metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), can be used. Other than the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like may be used. The substances mentioned here are mainly ones that have an electron mobility of $10^{-6}$ cm$^2$/V·s or higher. The electron transport layer is not necessarily a single layer and may be formed of a stack including two or more layers made of the aforementioned substance.

The electron injection layer 705 is a layer containing a substance having a high electron injection property. For the electron injection layer 705, an alkali metal, an alkaline earth metal, or a compound thereof, such as lithium, cesium, calcium, lithium fluoride, cesium fluoride, calcium fluoride, or lithium oxide, can be used. Further, a rare earth metal compound such as erbium fluoride may be used. A substance for forming the electron transport layer 704 may be used.

Note that the hole injection layer 701, the hole transport layer 702, the light-emitting layer 703, the electron transport layer 704, and the electron injection layer 705 which are described above can each be formed by an evaporation method (e.g., a vacuum evaporation method), an ink-jet method, a coating method, or the like.

Then, the light-transmitting electrode 617 is formed over the EL layer 616.

Since the light-transmitting electrode 617 is provided on the side where light is extracted, it is composed of a light-transmitting material. As the light-transmitting material, indium oxide, indium tin oxide, indium zinc oxide, zinc oxide, zinc oxide to which gallium is added, graphene, or the like can be used.

For the light-transmitting electrode 617, a metal material such as gold, platinum, nickel, tungsten, chromium, molybdenum, iron, cobalt, copper, palladium, or titanium can be used. A nitride of the metal material (e.g., titanium nitride) or the like may be used. In the case of using the metal material (or the nitride thereof), the light-transmitting electrode 617 may be thinned such that it can transmit light.

In the display device according to one embodiment of the present invention, the EL layers 616 in a plurality of light-emitting elements in the pixel area are shared by the pixels and are composed of continuous films. For this reason, the fabrication process does not require the EL layers to be selectively deposited according to each color by a metal mask, enabling a film to be deposited in a large area at once. Consequently, the size and productivity of the display device can be increased. Moreover, the display region in the display portion can be increased. Further, defects due to, for example, particle contamination which may be caused by the use of a metal mask can be avoided, which enables high production yield of the display device.

A plurality of EL layers may be provided between the reflective electrode 613 and the light-transmitting electrode 617 as shown in FIGS. 3B1 and 3B2. FIG. 3B1 illustrates an example including two EL layers, in which a first EL layer 800 and a second EL layer 801 are provided between the reflective electrode 613 and the light-transmitting electrode 617, with a charge generation layer 803 laid between the first EL layer 800 and the second EL layer 801. FIG. 3B2 illustrates an example including three EL layers, in which the first EL layer 800, the second EL layer 801, and a third EL layer 802 are provided between the reflective electrode 613 and the light-transmitting electrode 617, with charge generation layers 803a and 803b laid between the first EL layer 800 and the second EL layer 801 and between the second EL layer 801 and the third EL layer 802, respectively.

When the EL layers are stacked, the electron generation layer (the electron generation layer 803, 803a, or 803b) is preferably provided between the stacked EL layers (between the first EL layer 800 and the second EL layer 801 or between the second EL layer 801 and the third EL layer 802). The charge generation layers 803, 803a, and 803b can each be formed using the above composite material. Further, the charge generation layers 803, 803a, and 803b may each have a layered structure including a layer containing the composite material and a layer containing another material. In that case, as the layer containing another material, a layer containing an electron donating substance and a substance having a high electron transport property, a layer formed of a transparent conductive film, or the like can be used. As for a light-emitting element having such a structure, problems such as energy transfer and quenching are less likely to occur, and thus a light-emitting element which has both high luminous efficiency and long lifetime can be easily obtained due to expansion in the choice of materials. Moreover, a light-emitting element which provides phosphorescence from one of the EL layers and fluorescence from the other can be readily obtained. Note that this structure can be combined with any of the above structures of the EL layer.

When the charge generation layer is provided between the stacked EL layers as illustrated in FIGS. 3B1 and 3B2, the element can have high luminance and a long lifetime while the current density is kept low. In addition, a voltage drop due to resistance of an electrode material can be reduced, whereby uniform light emission in a large area is possible.

In the case of a stack-type element having a structure in which two EL layers are stacked, white light emission can be extracted outside when colors of lights emitted by a first EL layer and a second EL layer are complementary colors. White light emission can also be produced by a structure in which a plurality of light-emitting layers including first and second EL layers is included and in which the colors of lights emitted by the first and second EL layers are complementary colors. Examples of complementary colors include blue and yellow and blue-green and red. The substance which emits blue light, yellow light, blue-green light, or red light may be selected as appropriate, for example, from the above-stated light-emitting substances.

An example of a light-emitting element having a structure in which a plurality of EL layers is stacked will be described below. First, an example of a structure in which each of the first EL layer and the second EL layer includes a plurality of light-emitting layers which emit light of complementary colors will be described. With this structure, white light emission can be obtained.

For example, the first EL layer includes a first light-emitting layer which has an emission spectrum with a peak in the wavelength range of blue to blue-green, and a second light-emitting layer which has an emission spectrum with a peak in the wavelength range of yellow to orange. The second EL layer includes a third light-emitting layer which has an emission spectrum with a peak in the wavelength range of blue-green to green, and a fourth light-emitting layer which has an emission spectrum with a peak in the wavelength range of orange to red.

In this case, light emission from the first EL layer is a combination of light emission from both the first light-emitting layer and the second light-emitting layer and thus exhibits an emission spectrum having both a peak in the wavelength range of blue to blue-green and a peak in the wavelength range of yellow to orange. That is, the first EL layer emits light of two-wavelength type white or a two-wavelength type color close to white.

In addition, light emission from the second EL layer is a combination of light emission from both the third light-emitting layer and the fourth light-emitting layer and thus exhibits an emission spectrum having both a peak in the wavelength range of blue-green to green and a peak in the wavelength range of orange to red. That is, the second EL layer emits light of two-wavelength type white color or a two-wavelength type color close to white, which is different from that of the first EL layer.

Accordingly, by combining the light emission from the first EL layer and the light emission from the second EL layer, white light emission which covers the wavelength range of blue to blue-green, the wavelength range of blue-green to green, the wavelength range of yellow to orange, and the wavelength range of orange to red can be obtained.

Further, the wavelength range of yellow to orange (greater than or equal to 560 nm and less than 580 nm) is a wavelength range of high spectral luminous efficacy; thus, application of an EL layer which includes a light-emitting layer having an emission spectrum peak in the wavelength range of yellow to orange is useful. For example, a structure can be used in which a first EL layer which includes a light-emitting layer having an emission spectrum peak in a blue wavelength range, a second EL layer which includes a light-emitting layer having an emission spectrum peak in an yellow wavelength range, and a third EL layer which includes a light-emitting layer having an emission spectrum peak in a red wavelength range are stacked.

Further, two or more EL layers exhibiting yellow to orange color may be stacked. The power efficiency can be further improved by stacking two or more EL layers exhibiting yellow to orange color.

For example, in the case of a light-emitting element in which three EL layers are stacked as in FIG. 3B1, a second EL layer and a third EL layer each of which includes a light-emitting layer having an emission spectrum peak in yellow to orange wavelength range may be stacked over a first EL layer which includes a light-emitting layer having an emission spectrum peak in a blue wavelength range (greater than or equal to 400 nm and less than 480 nm). Note that the wavelengths of the peaks of the spectra of light emitted from the second EL layer and the third EL layer may be the same or different from each other.

When the number of EL layers which are stacked is increased, the power efficiency of a light-emitting element can be improved; however, there occurs a problem that the manufacturing process becomes complicated. Thus, the structure in which three EL layers are stacked as in FIG. 3B2 is preferable because the power efficiency is high as compared to the case of a structure of two EL layers and the manufacturing process is simple as compared to the case of a structure of four or more EL layers.

As illustrated in FIG. 3C, the EL layer may include the hole injection layer 701, the hole transport layer 702, the light-emitting layer 703, the electron transport layer 704, an electron injection buffer layer 706, an electron relay layer 707, and a composite material layer 708 which is in contact with the light-transmitting electrode 617, between the reflective electrode 613 and the light-transmitting electrode 617.

It is preferable to provide the composite material layer 708 which is in contact with the light-transmitting electrode 617 because damage caused to the EL layer 616 particularly when the light-transmitting electrode 617 is formed by a sputtering method can be reduced. The composite material layer 708 can be formed using the above composite material in which an organic compound having a high hole transport property is mixed with an acceptor substance.

Further, by providing the electron injection buffer layer 706, an injection barrier between the composite material layer 708 and the electron transport layer 704 can be reduced; thus, electrons generated in the composite material layer 708 can be easily injected to the electron transport layer 704.

Any of the following substances having high electron injection properties can be used for the electron injection buffer layer 706: an alkali metal, an alkaline earth metal, a rare earth metal, a compound of the above metal (e.g., an alkali metal compound (e.g., an oxide such as lithium oxide, a halide, and carbonate such as lithium carbonate or cesium carbonate), an alkaline earth metal compound (e.g., an oxide, a halide, and carbonate), a rare earth metal compound (e.g., an oxide, a halide, and carbonate), and the like.

Further, in the case where the electron injection buffer layer 706 contains a substance having a high electron transport property and a donor substance, the donor substance is preferably added so that the mass ratio of the donor substance to the substance having a high electron transport property is from 0.001:1 to 0.1:1. Note that as the donor substance, an organic compound such as tetrathianaphthacene (abbreviation: TTN), nickelocene, or decamethylnickelocene may be used as well as an alkali metal, an alkaline earth metal, a rare earth metal, a compound of the above metal (e.g., an alkali metal compound (e.g., an oxide such as lithium oxide, a halide, and carbonate such as lithium carbonate or cesium carbonate), an alkaline earth metal compound (e.g., an oxide, a halide, and carbonate), and a rare earth metal compound (e.g., an oxide, a halide, and carbonate). Note that as the substance having a high electron transport property, a material similar to the material for the electron transport layer 704 described above can be used.

Furthermore, the electron relay layer 707 is preferably formed between the electron injection buffer layer 706 and the composite material layer 708. The electron relay layer 707 is not necessarily provided; however, by providing the electron relay layer 707 having a high electron transport property, electrons can be rapidly transported to the electron injection buffer layer 706.

The structure in which the electron relay layer 707 is sandwiched between the composite material layer 708 and the electron injection buffer layer 706 is a structure in which the acceptor substance contained in the composite material layer 708 and the donor substance contained in the electron injection buffer layer 706 are less likely to interact with each other, and thus their functions hardly interfere with each other. Accordingly, an increase in driving voltage can be prevented.

The electron relay layer 707 contains a substance having a high electron transport property and is formed so that the LUMO level of the substance having a high electron transport property is located between the LUMO level of the acceptor substance contained in the composite material layer 708 and the LUMO level of the substance having a high electron transport property contained in the electron transport layer 704. In the case where the electron relay layer 707 contains a donor substance, the donor level of the donor substance is controlled so as to be located between the LUMO level of the acceptor substance in the composite material layer 708 and the LUMO level of the substance having a high electron transport property contained in the electron transport layer 704. As a specific value of the energy level, the LUMO level of the substance having a high electron transport property contained in the electron relay layer 707 is preferably greater than or equal to −5.0 eV, more preferably greater than or equal to −5.0 eV and less than or equal to −3.0 eV.

As the substance having a high electron transport property contained in the electron relay layer 707, a phthalocyanine-based material or a metal complex having a metal-oxygen bond and an aromatic ligand is preferably used.

As the phthalocyanine-based material contained in the electron relay layer 707, specifically, any of the following is preferably used: CuPc, a phthalocyanine tin(II) complex (SnPc), a phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc).

As the metal complex having a metal-oxygen bond and an aromatic ligand, which is contained in the electron relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex which has a metal-oxygen double bond is considered stable. Thus, the use of the metal complex having a metal-oxygen double bond makes it possible to drive the light-emitting element at low voltage more stably.

As the metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that as the phthalocyanine-based material described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent; thus, the phthalocyanine derivative has an advantage of being easily handled during formation of a light-emitting element and an advantage of facilitating maintenance of an apparatus used for film formation.

The electron relay layer 707 may further contain a donor substance. Examples of the donor substance include organic compounds such as tetrathianaphthacene (abbreviation: TTN), nickelocene, and decamethylnickelocene, in addition to an alkali metal, an alkaline earth metal, a rare earth metal, and compounds of the above metals (e.g., alkali metal compounds (including an oxide such as lithium oxide, a halide, and carbonates such as lithium carbonate and cesium carbonate), alkaline earth metal compounds (including an oxide, a halide, and a carbonate), and rare earth metal compounds (including an oxide, a halide, and a carbonate)). When such a donor substance is contained in the electron relay layer 707, electrons can be transferred easily and the light-emitting element can be driven at lower voltage.

In the case where a donor substance is contained in the electron relay layer 707, other than the materials described above as the substance having a high electron transport property, a substance having a LUMO level greater than the acceptor level of the acceptor substance contained in the composite material layer 708 may be used. As a specific energy level of the substance having a LUMO level, a LUMO level is greater than or equal to −5.0 eV, preferably greater than or equal to −5.0 eV and less than or equal to −3.0 eV. As examples of such a substance, a perylene derivative and a nitrogen-containing condensed aromatic compound can be given. Note that a nitrogen-containing condensed aromatic compound is preferably used for the electron relay layer 707 because of its stability.

As specific examples of the perylene derivative, the following can be given: 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), and N,N'-dihexyl-3,4,9,10-perylenetetracarboxylic diimide (Hex PTC).

As specific examples of the nitrogen-containing condensed aromatic compound, the following can be given: pirazino[2,3-f][1,10]phenanthroline-2,3-dicarbonitrile (PPDN), 2,3,6,7,10,11-hexacyano-1,4,5,8,9,12-hexaazatriphenylene (HAT $(CN)_6$), 2,3-diphenylpyrido[2,3-b]pyrazine (2PYPR), and 2,3-bis(4-fluorophenyl)pyrido[2,3-b]pyrazine (F2PYPR).

Other examples are 7,7,8,8-tetracyanoquinodimethane (abbreviation: TCNQ), 1,4,5,8-naphthalenetetracarboxylic-dianhydride (abbreviation: NTCDA), perfluoropentacene, copper hexadecafluoro phthalocyanine (abbreviation: $F_{16}CuPc$), N,N'-bis(2,2,3,3,4,4,5,5,6,6,7,7,8,8,8-pentadecafluorooctyl)-1,4,5,8-naphthalenetetracarboxylic diimide (abbreviation: NTCDI-C8F), 3',4'-dibutyl-5,5''-bis(dicyanomethylene)-5,5''-dihydro-2,2':5',2''-terthiophen (abbreviation: DCMT), and methanofullerene (e.g., [6,6]-phenyl $C_{61}$ butyric acid methyl ester).

Note that in the case where a donor substance is contained in the electron relay layer 707, the electron relay layer 707 may be formed by a method such as co-evaporation of the substance having a high electron transport property and the donor substance.

The hole injection layer 701, the hole transport layer 702, the light-emitting layer 703, and the electron transport layer 704 may each be formed using any of the above materials.

The methods and structures described in this embodiment can be combined as appropriate with any of the methods and structures described in the other embodiments.

(Embodiment 3)

In this embodiment, display device that achieves three-dimensional (3D) image display and uses the display device according to the above embodiments as its display panel will be described with reference to drawings.

A display device shown in FIG. 4A includes a display panel 10 and a shutter panel 20. The display panel 10 includes a pixel area having a matrix of a plurality of pixels, specifically 350 pixels or more per one inch (i.e., the horizontal resolution is 350 ppi or more), more preferably 400 or more pixels per one inch (i.e., the horizontal resolution is 400 ppi or more); and a color filter layer overlapped with the pixel area. The shutter panel 20 is provided on the side where the display panel 10 emits light, that is, a side of the display device which is viewed by the viewer. Note that the display device shown in FIG. 4A uses the display device according to the above embodiments as the display panel 10.

The shutter panel 20 includes a plurality of optical shutter regions. The optical shutter region includes a liquid crystal element and a switching element selecting the transmissive or non-transmissive state of the liquid crystal element. When the liquid crystal element is put in a non-transmissive state, light emitted by the display panel 10 can be blocked.

By selectively providing a light-blocking region (bather region) for blocking light emitted from the display panel 10, a particular viewing angle is given. Consequently, light is emitted to different space regions for a right-eye and a left-eye, so that the viewer recognizes only images corresponding to the respective eyes. Thus, the display device can display a 3D image. In other words, in FIG. 4A, the shutter panel 20 serves as a so-called parallax barrier and providing the shutter panel 20 enables the viewer to see light emitted by the display panel 10 with a parallax, which allows the display device to display a 3D image. When the light-blocking region is not provided in the shutter panel 20 (when all the liquid crystal elements included in the shutter panel 20 are brought into a transmissive state), a two-dimensional (2D) image can be displayed, and switching between 3D image display and 2D image display can be achieved by the switching of the liquid crystal elements included in the shutter panel 20.

Note that a plurality of optical shutter regions included in the shutter panel 20 can be addressed either with active matrix addressing in which a switching element is provided for each of optical shutter regions in a dot pattern, or with passive matrix addressing in which a switching element is provided for a plurality of optical shutter regions.

For the electrodes of the liquid crystal elements, the electrodes connected to the switching elements may be formed in stripes and the others in a plate shape to form optical shutter regions in a line pattern. The optical shutter regions can be formed in a dot pattern by using a structure in which a pair of electrodes in stripes are overlapped with each other in a lattice pattern with liquid crystals therebetween, or a structure in which the electrodes connected to the switching elements are formed in a dot pattern. Thus, a light-blocking region or a light-transmitting region can be controlled more accurately.

By addressing the optical shutter regions by the active matrix addressing and separately addressing a plurality of pixels 100 included in the display panel 10 and the optical shutter regions included in the shutter panel 20, both 3D image display and 2D image display can be achieved.

Although not shown in this embodiment, the shutter panel 20 is provided with an optical film such as a polarizing plate, a retardation plate, or an anti-reflection film, or the like as appropriate. The shutter panel 20 can use a variety of transmissive liquid crystal elements and a variety of liquid crystal modes.

The display device according to this embodiment achieves 3D image display and 2D image display by separately driving a plurality of pixel 100 included in the display panel 10 and a plurality of optical shutter regions included in the shutter panel 20. Here, drive frequency needed for the display panel 10 and drive frequency needed for the shutter panel 20 are different. In other words, the display panel 10 needs to be constantly driven in order to display a moving image, and the shutter panel 20 needs to be regularly or irregularly driven in accordance with switching between 3D image display and 2D image display. In that case, a period during which the shutter panel 20 needs to be driven is much shorter than a period during which the shutter panel 20 is kept in a certain state.

The display device in FIG. 4A preferably further includes a controller 30 for controlling the operation of the display panel 10 and shutter panel 20. The controller 30 has a function of controlling movie display in the display panel 10 and a function of making the shutter panel 20 operate only in a desired period (hereinafter also referred to as operation period) and retaining the state of the shutter panel 20 in a period other than the operation period (hereinafter also referred to as retention period). Providing the retention period for the operation of the shutter panel 20 can reduce the power consumption of the display device.

FIG. 4B is an example of an equivalent circuit diagram of the optical shutter region. The optical shutter region can include the transistor 107, the liquid crystal element 106 to which a signal is input through the transistor 107, and the capacitor 108 for holding the potential of the signal. Whether light is transmitted is selected by controlling the alignment of liquid crystals in the liquid crystal element in accordance with the potential of the signal. Thus, in order to perform the above operation, it is necessary to hold the potential of the signal for a long time. In order to meet the need, a channel region of the transistor 107 is preferably formed using an oxide semiconductor. This is because leakage of electric charge through the transistor 107 can be reduced, so that a fluctuation in the potential of the signal can be suppressed.

An oxide semiconductor has a wider band gap and lower intrinsic carrier density than silicon. Thus, with the use of an oxide semiconductor for the semiconductor layer of the transistor 107, a transistor that has much lower off-state current than a transistor containing a normal semiconductor such as silicon or germanium can be formed.

A transistor including a highly-purified oxide semiconductor has extremely low off-state current. Specifically, the concentration of hydrogen in the highly-purified oxide semiconductor that is measured by secondary ion mass spectroscopy (SIMS) is $5 \times 10^{19}/cm^3$ or lower, preferably $5 \times 10^{18}/cm^3$ or lower, more preferably $5 \times 10^{17}/cm^3$ or lower, still more preferably $1 \times 10^{16}/cm^3$ or lower. In addition, the carrier density of the oxide semiconductor that can be measured by Hall effect measurement is lower than $1 \times 10^{14}/cm^3$, preferably lower than $1 \times 10^{12}/cm^3$, more preferably lower than $1 \times 10^{11}/cm^3$. Further, the band gap of the oxide semiconductor is 2 eV or more, preferably 2.5 eV or more, more preferably 3 eV or more.

Note that various experiments can prove the low off-state current of the transistor including the highly-purified oxide semiconductor film as an active layer. For example, even with an element with a channel width of $1 \times 10^6$ µm and a channel length of 10 µm, in a range of 1 to 10 V of voltage (drain voltage) between a source terminal and a drain terminal, off-state current can be lower than or equal to the measurement limit of a semiconductor parameter analyzer, that is, lower than or equal to $1 \times 10^{-13}$ A. In that case, it can be seen that off-state current density corresponding to a value obtained by division of the off-state current by the channel width of the transistor is lower than or equal to 100 zA/µm.

Note that the concentration of hydrogen in the semiconductor film and the conductive film can be measured by secondary ion mass spectroscopy (SIMS). It is known that it is difficult to obtain precise data in the vicinity of a surface of a sample or in the vicinity of an interface between stacked films formed using different materials by a SIMS analysis in principle. Thus, in the case where the distribution of the concentration of hydrogen in the film in a thickness direction is analyzed by SIMS, an average value in a region of the film in which the value is not greatly changed and substantially the same value can be obtained is employed as the hydrogen concentration. In addition, in the case where the thickness of the film is small, a region where substantially the same value can be obtained cannot be found in some cases due to the influence of the hydrogen concentration of the films adjacent to each other. In that case, the maximum value or the minimum value of the hydrogen concentration in the region of the film is employed as the hydrogen concentration of the film. Further, in the case where a mountain-shaped peak having the maximum value or a valley-shaped peak having the minimum value do not exist in the region of the film, the value at an inflection point is employed as the hydrogen concentration.

Note that a quaternary metal oxide such as an In—Sn—Ga—Zn—O-based oxide semiconductor; a ternary metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a binary metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; an In—O-based oxide semiconductor; a Sn—O-based oxide semiconductor; a Zn—O-based oxide semiconductor; or the like can be used as the oxide semiconductor. In this specification, for example, an In—Sn—Ga—Zn—O-based oxide semiconductor is a metal oxide containing indium (In), tin (Sn), gallium (Ga), and zinc (Zn), and there is no particular limitation on the stoichiometric proportion thereof. The oxide semiconductor may contain silicon.

The oxide semiconductor can be represented by a chemical formula, $InMO_3(ZnO)_m$ (m>0, m is not necessarily a natural number). Here, M represents one or more metal elements selected from Ga, Al, Mn, or Co.

In the case where an In—Zn—O-based material is used for the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=1:2 to 10:1 in a molar ratio), more preferably In:Zn=1.5:1 to 15:1 in an atomic ratio ($In_2O_3$:ZnO=3:4 to 15:2 in a molar ratio). For example, when a target used for deposition of an In—Zn—O-based oxide semiconductor has a composition ratio of In:Zn:O=X:Y:Z in an atomic ratio, where Z>1.5X+Y.

An oxide semiconductor film is in a single crystal state, a polycrystalline (also referred to as polycrystal) state, an amorphous state, or the like.

Preferably, a CAAC-OS (c-axis aligned crystalline oxide semiconductor) film can be used as the oxide semiconductor film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between the amorphous part and a crystal part in the CAAC-oxide semiconductor film is not clear. Further, with the TEM, a grain boundary in the CAAC-oxide semiconductor film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic order which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85 to 95°. In addition, a simple term "parallel" includes a range from −5 to 5°.

In the CAAC-OS film, distribution of crystal parts is not necessarily uniform. For example, in the formation process of the CAAC-OS film, in the case where an oxide semiconductor film is formed on one surface and crystal growth occurs from a surface side of the oxide semiconductor film, the proportion of crystal parts in the vicinity of the surface of the CAAC-OS film is higher than that in the vicinity of the surface where the CAAC-OS film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by deposition or by performing treatment for crystallization such as heat treatment after deposition.

In a CAAC-OS film, metal atoms and oxygen atoms are bonded in an orderly manner compared with in an amorphous oxide semiconductor film. That is to say, the number of oxygen atoms coordinating to each metal atom may vary when the oxide semiconductor film is amorphous, but in a CAAC-OS film, there are few variations in the number of oxygen atoms coordinating to each metal. Therefore, microscopic oxygen deficiency is reduced and the instability or movement of charge due to attachment and detachment of hydrogen atoms (including hydrogen ions) or alkali metal atoms is reduced.

For this reason, forming a transistor with a CAAC-OS film can reduce fluctuations in the electrical characteristics of the transistor such as threshold voltage, which occur after the transistor is subjected to light irradiation such as irradiation of visible or ultraviolet light or a bias-temperature (BT) stress test. Thus, a transistor having stable electric characteristics can be formed.

FIGS. 4C and 4D are flow charts each illustrating an operation example of the controller 30 in FIG. 4A. Specifically, FIG. 4C is a flow chart illustrating an operation example of the controller 30 for controlling the display panel 10, and FIG. 4D is a flow chart illustrating an operation example of the controller 30 for controlling the shutter panel 20.

After the controller 30 starts to operate, a display control signal is output to the display panel 10 (see FIG. 4C). Here, the display control signal is an image signal, a signal for controlling operation (e.g., a clock signal), or the like for the plurality of pixels 100 arranged in a matrix. The display control signal is constantly supplied to the display panel 10 as long as the controller 30 continues display in the display panel 10.

Further, in the case where the controller 30 operates and the display device performs 3D image display, the controller 30 outputs a light-blocking control signal to the shutter panel 20 (see FIG. 4D). Here, the light-blocking control signal refers, for example, to a control signal (a signal for determining whether the liquid crystal element 106 is shielded from light), a signal for controlling operation (e.g., a clock signal), or the like for the transistor 107. After control signals are supplied to the transistor 107, supply of light-blocking control signals is stopped. Note that in the case where a region in which 3D image display is performed is changed, the controller 30 outputs a light-blocking control signal to the shutter panel 20 again. In this manner, the light-blocking control signal is regularly or irregularly supplied to the shutter panel 20 when 3D image display is performed.

Note that in the flow chart in FIG. 4D, in the case where the light-blocking control signal is not supplied to the shutter panel 20 for a long time, a light-blocking control signal for performing 3D image display can be supplied to the shutter panel 20 again (refresh). In other words, in the case where 3D image display is performed in the display device for a long time, a light-blocking control signal for performing 3D image display can be supplied to the shutter panel 20 as appropriate (regularly or irregularly).

As described above, the display device includes the display panel 10 and the shutter panel 20 placed on the side where the display panel 10 emits light, and thus achieves 3D image display. Moreover, the display device can display high-definition 3D images when using the display device shown in the above embodiments as its display panel.

The operation in this embodiment eliminates the need for constantly driving the shutter panel 20, so that the power consumption of the display device can be reduced.

The methods and structures described in this embodiment can be combined as appropriate with any of the methods and structures described in the other embodiments.

(Embodiment 4)

The display device according to one embodiment of the present invention can be used for display devices, laptops, or image reproducing devices provided with recording media (typically, devices which reproduce the content of recording media such as digital versatile discs (DVDs) and have displays for displaying the reproduced images). Other examples of electronic devices that can use the display device according to one embodiment of the present invention include cellular phones, portable game machines, personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. In this example, specific examples of these electronic devices are described with reference to FIGS. 5A to 5C. These electronic devices may include a battery.

Figure 5A:
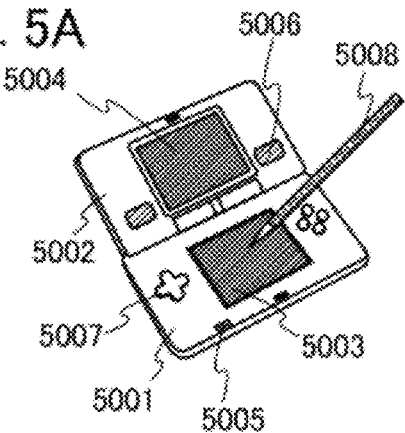
FIGS. 5A to 5C are diagrams illustrating one embodiment of electronic devices.

FIG. 5A illustrates a portable game machine, which includes a housing 5001, a housing 5002, a display portion 5003, a display portion 5004, a microphone 5005, speakers 5006, an operation key 5007, a stylus 5008, and the like. The display device described in the above embodiment can be used as the display portion 5003 or the display portion 5004. It is possible to provide a portable game machine capable of displaying a high-definition image when the display device described in the above embodiment is used as the display portion 5003 or 5004. Note that although the portable game machine in FIG. 5A has the two display portions 5003 and 5004, the number of display portions included in the portable game machine is not limited thereto.

Figure 5B:
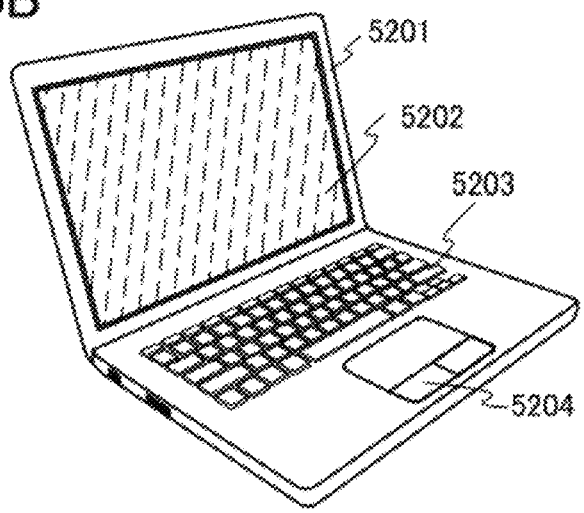

FIG. 5B illustrates a laptop, which includes a housing 5201, a display portion 5202, a keyboard 5203, a pointing device 5204, and the like. The display device described in the above embodiment can be used as the display portion 5202. It is possible to provide a laptop capable of displaying a high-definition image when the display device described in the above embodiment is used as the display portion 5202.

Figure 5C:
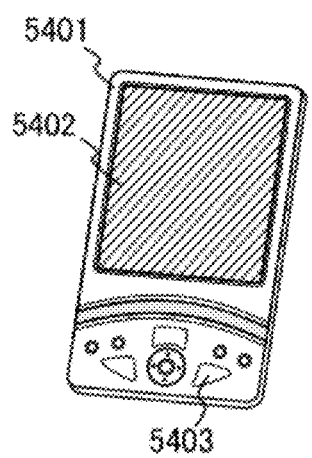

FIG. 5C illustrates a personal digital assistant, which includes a housing 5401, a display portion 5402, operation keys 5403, and the like. The display device described in the above embodiment can be used as the display portion 5402. It is possible to provide a personal digital assistant capable of displaying a high-definition image when the display device described in the above embodiment is used as the display portion 5402.

The methods and structures described in this embodiment can be combined as appropriate with any of the methods and structures described in the other embodiments.

EXAMPLE 1

In Example 1, a specific example of a method for fabricating the SOI substrate described in Embodiment 1 is described with reference to FIGS. 6A to 6D and the evaluation results of the crystalline state of a semiconductor layer in the SOI substrate fabricated by that method is described.

<Method for Fabricating SOI Substrate>

First, a square single crystal silicon substrate 6000 which is 126.6 mm on a side was prepared. The single crystal silicon substrate 6000 was subjected to thermal oxidation treatment at 950° C. in an oxidizing atmosphere to which chlorine (Cl) is added, forming an approximately 100-nm-thick thermal oxidation film 6002 oxidized with hydrochloric acid on a surface of the single crystal silicon substrate 6000 (see FIG. 6A). After the formation of the thermal oxidation film 6002, a surface of the thermal oxidation film 6002 was subjected to cleaning.

Figure 6A:
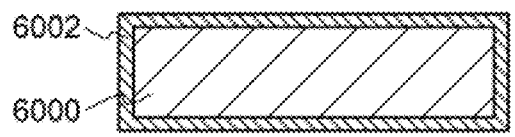
FIGS. 6A to 6D are diagrams illustrating an example of a method for fabricating an SOI substrate.
Figure 6B:
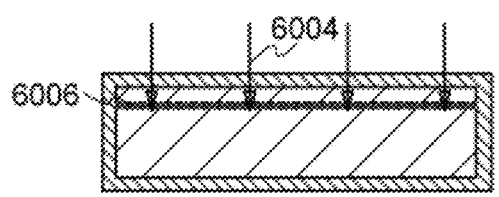

Next, ion implantation 6004 was performed on the single crystal silicon substrate 6000 from one side to form a micro-bubble region 6006 at a predetermined depth from a surface of the single crystal silicon substrate 6000 (see FIG. 6B). Note that ion implantation was performed with an ion doping system while 100% hydrogen gas was introduced at a flow rate of 50 sccm and used the following conditions: an accelerating voltage of 50 kV, a beam current density of 6.35 $\mu$A/cm$^2$, and a dose of $2.7 \times 10^{16}$ ions/cm$^2$. Note that hydrogen ions include $H^+$, $H_2^+$ and $H_3^+$; in Example 1, $H_3^+$ was used as a main ion.

Figure 6C:
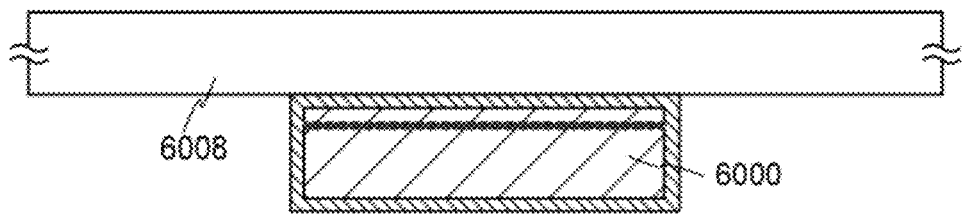
Figure 6D:
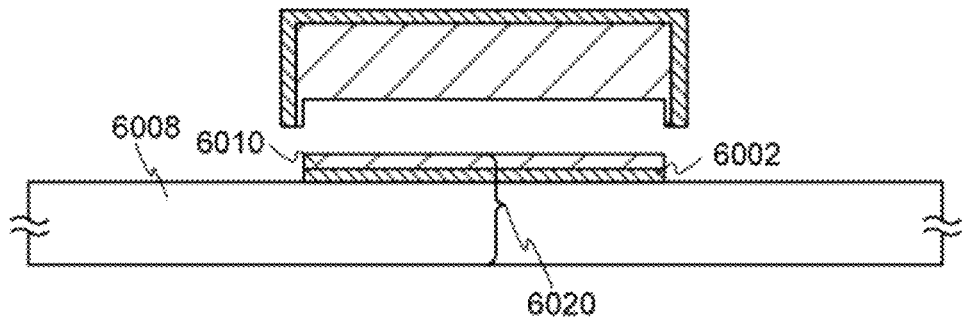

Then, a glass substrate 6008 (aluminoborosilicate glass) was bonded to a face of the single crystal silicon substrate 6000 (see FIG. 6C). Note that before the glass substrate 6008 was bonded, a face of the single crystal silicon substrate 6000 to which the glass substrate 6008 was to be bonded was subjected to UV ozone treatment and cleaning.

Next, the single crystal silicon substrate 6000 was subjected to heat treatment. Consequently, ions implanted in the single crystal silicon substrate 6000 by the ion implantation 6004 are gathered in the micro-bubble region 6006 and a cleavage phenomenon occurs in the micro-bubble region 6006. Note that in the heat treatment, firstly, the single crystal silicon substrate 6000 and the glass substrate 6008 bonded to each other were placed in the electric furnace and subjected to heat treatment at 200° C. in a nitrogen atmosphere for 120 minutes, and the temperature in the furnace was raised at 7.2° C./m to perform heat treatment at 600° C. in a nitrogen atmosphere for 120 minutes.

Then, the single crystal silicon substrate 6000 and the glass substrate 6008 bonded to each other were taken out of the electric furnace, and the single crystal silicon substrate 6000 was separated from the glass substrate 6008. Thus, an SOI substrate 6020 in which a silicon thin film 6010 is over the glass substrate 6008 with a thermal oxidation film 6002 therebetween can be fabricated (see FIG. 6D).

Then, in order to repair crystal defects in the silicon thin film 6010 and improve surface flatness, the silicon thin film 6010 was irradiated with an excimer laser beam. The laser beam irradiation used the following conditions: a high vacuum state of $1\times10^{-4}$ Pa or less, a pulse repetition frequency of 30 Hz, and a scan speed of 0.5 minis Since laser energy density is slightly varied, for example, by the film thickness of the silicon thin film 6010, it is preferable to investigate in advance an optimal condition for making a surface of the silicon thin film flat (100 to 700 mJ/cm² or typically 200 to 300 mJ/cm²) and perform laser beam irradiation under such an energy condition.

<Evaluation of Crystallinity of Semiconductor Thin Film>

Figure 7:
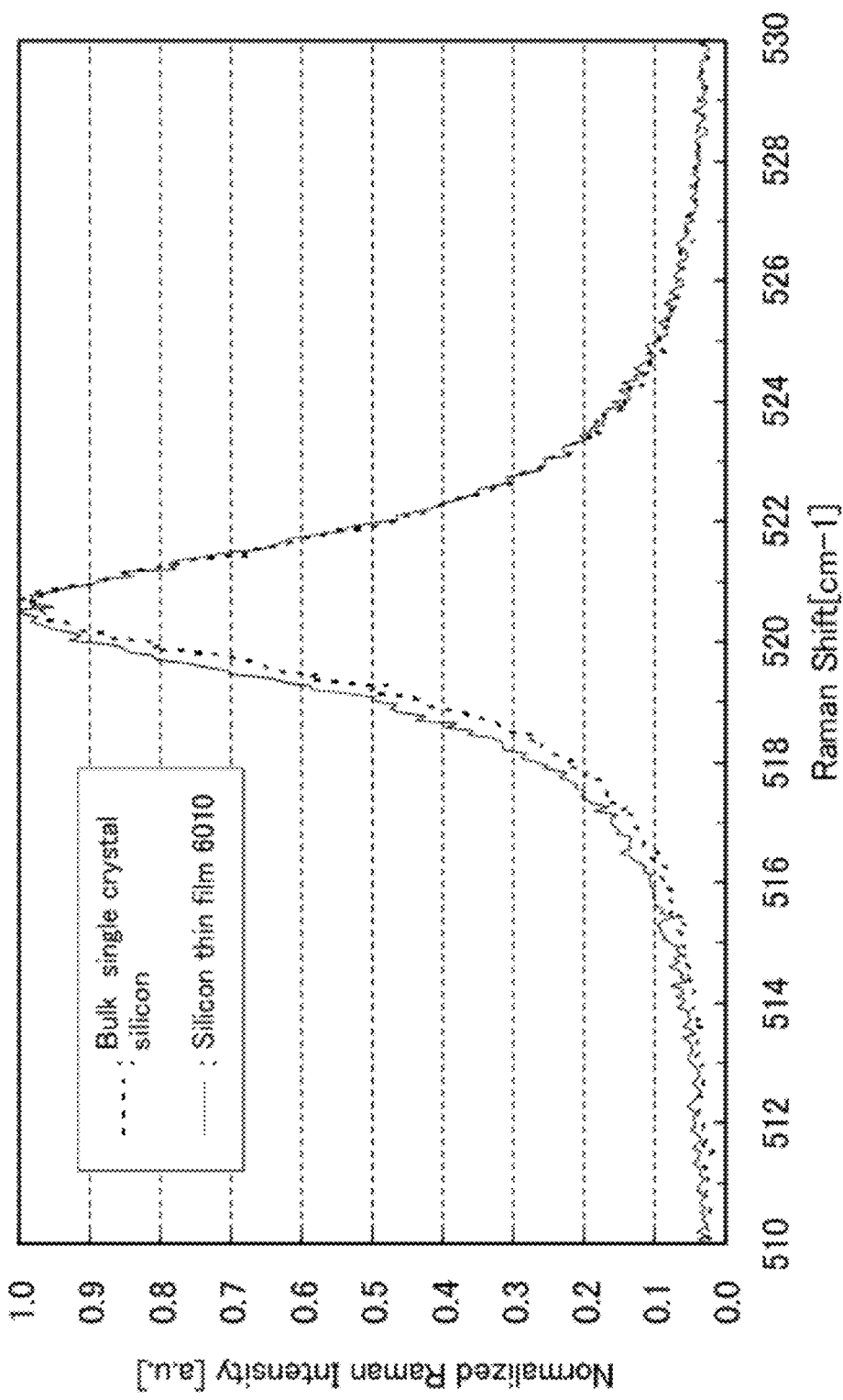
FIG. 7 is a graph showing the measurement results of Raman shifts of a silicon thin film and single crystal silicon.

The crystalline state of the silicon thin film 6010 in the SOI substrate 6020 fabricated by the above-described method was evaluated by using a Raman spectrometer. The crystalline state of bulk single crystal silicon was also evaluated for comparison. The results of both of them are shown in FIG. 7. Note that in FIG. 7, the horizontal axis represents Raman shift [cm⁻¹], while the vertical axis represents the normalized value of Raman intensity (arbitrary unit).

FIG. 7 confirms that Raman shifts of the silicon thin film 6010 and the bulk single crystal silicon are 520.5 cm⁻¹ and 520.6 cm⁻¹, respectively. It is also confirmed that the full widths at half maximum (FWHM) of the silicon thin film 6010 and the bulk single crystal silicon are 2.92 cm⁻¹ and 2.77 cm⁻¹, respectively. This confirms that the silicon thin film 6010 has spectral characteristics equivalent to those of the bulk single crystal silicon.

Figure 8:
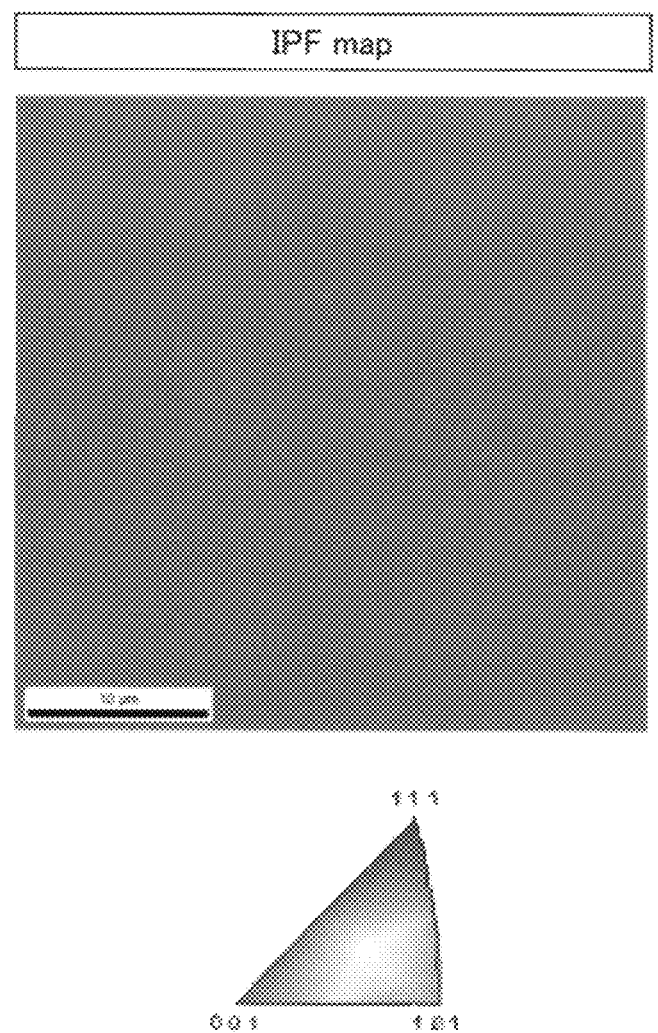
FIG. 8 is a diagram showing the EBSP measurement results of a silicon thin film.

FIG. 8 shows the results of an analysis on the crystal orientation in the silicon thin film 6010 performed by using electron backscatter diffraction pattern (EBSP).

FIG. 8 confirms that the crystals in all part of an evaluated region in the silicon thin film 6010 are oriented along the (100) face.

Therefore, the use of the silicon thin film 6010 in the SOI substrate 6020 fabricated by the above-described method enables a channel formation region in a semiconductor layer formed over the SOI substrate 6020 to be composed of a single crystal semiconductor.

EXAMPLE 2

In Example 2, the evaluation results of the electrical characteristics of a TFT fabricated using the SOI substrate described in Example 1 are described.

A TFT that was used for the evaluation of electrical characteristics has a top-gate structure, channel length (L) and channel width (W) of 3.4 μm and 10.2 μm (measured values) respectively, and a single drain structure. A 100-nm-thick silicon oxide film and a 50-nm-thick single crystal silicon film that were formed by the method described in Embodiment 1 were used as a base film and a semiconductor thin film, respectively. In addition, a 20-nm-thick silicon oxynitride film was used as a gate insulating film, and a stack in which a tungsten film (with a thickness of 370 nm) is stacked over a tantalum nitride film (with a thickness of 30 nm) was used as a gate electrode.

Figure 9A:
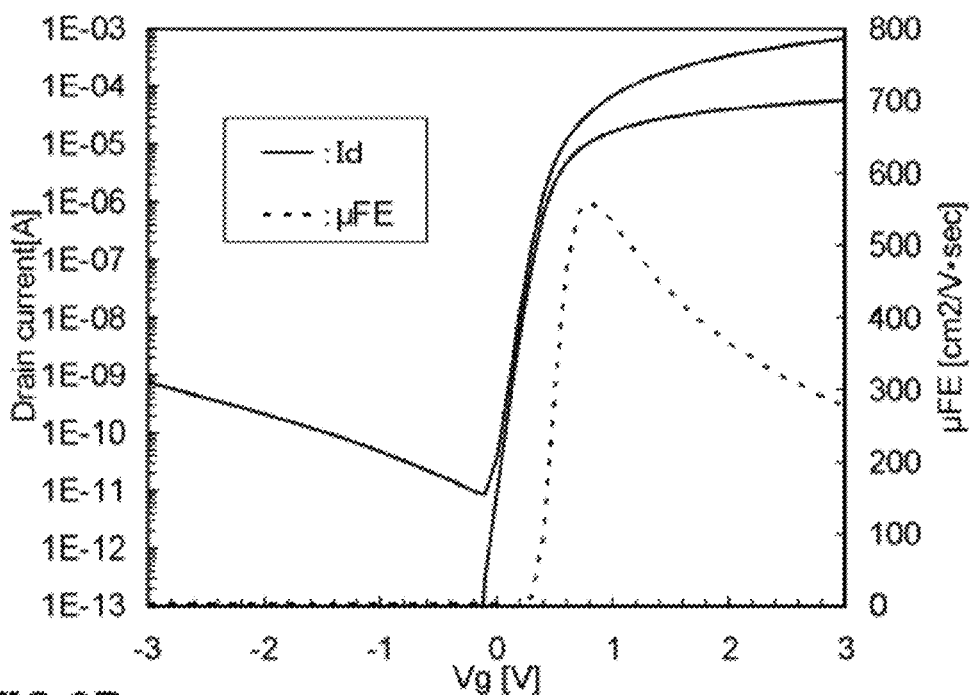
FIGS. 9A and 9B are graphs showing the measurement results of the electrical characteristics of a TFT fabricated by using the SOI substrate of Example 1.
Figure 9B:
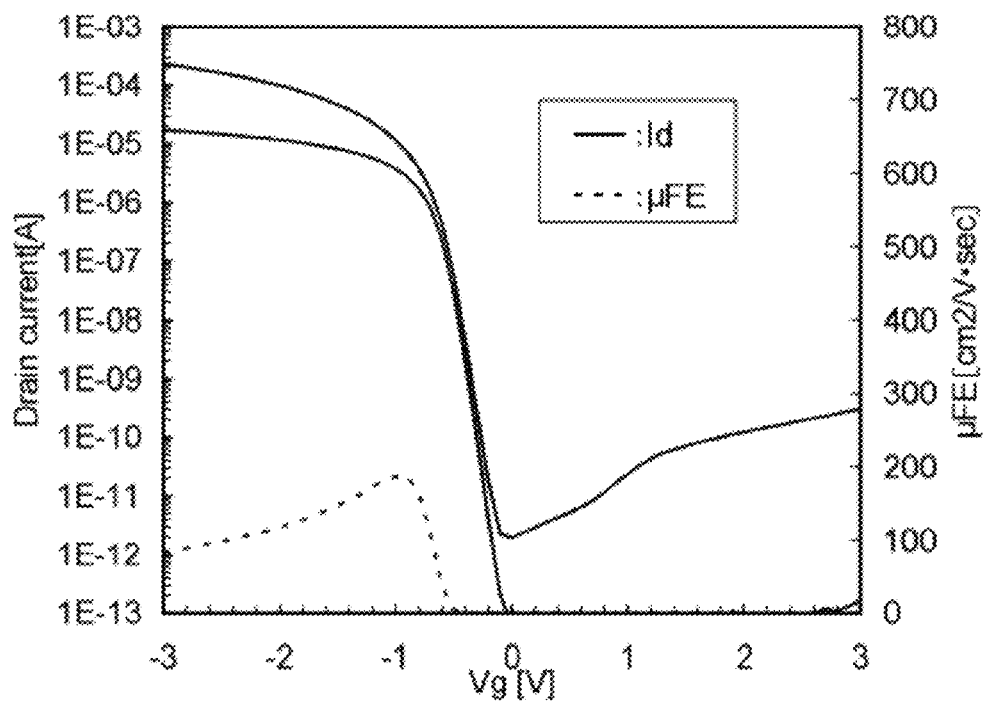

The results of the measurement of Vg-Id characteristics and mobility that was conducted using the above-stated TFT are shown in FIGS. 9A and 9B. Note that electrical characteristics evaluation was carried out on an n-channel TFT and a p-channel TFT having the above-described structure.

FIG. 9A shows the results of the electrical characteristics evaluation on the n-channel TFT. FIG. 9A shows that the S value was 71 mV/dec and the mobility was 511 cm²/Vs. In addition, the on-off ratio was $1\times10^9$ or more.

FIG. 9B shows the results of the electrical characteristics evaluation on the p-channel TFT. FIG. 9B shows that the S value was 72 mV/dec and the mobility was 184 cm²/Vs. In addition, the on-off ratio was found to be $1\times10^9$ or more.

The above results confirmed that the TFT fabricated by the SOI substrate described in Example 1 was characterized by high mobility, high on current, and a small S value. It was also confirmed that the silicon thin film 6010 had no defects at grain boundaries because it was made of single crystal silicon, and thus was characterized by low off-state current.

In order to examine variations in Vth value between the above-described n-channel TFTs and p-channel TFTs, 100 points in each TFT were measured to find out statistical probability distribution of the Vth value. Note that in the statistical probability distribution graph, the horizontal axis represents the Vth value (V), while the vertical axis represents the cumulative frequency. As variations between the TFTs in Vth value decrease, the gradient of a pattern of dots increases (i.e., the gradient of the pattern of dots becomes nearly vertical).

FIG. 10 is a statistical probability distribution graph of the Vth values of the n-channel TFTs and p-channel TFTs. FIG. 10 confirms that both the n-channel TFTs and the p-channel TFTs have very small variations in Vth value.

The above results confirmed that TFTs fabricated by the SOI substrate described in Example 1 were characterized in that they have very small variations in Vth value.

This application is based on Japanese Patent Application serial No. 2011-040486 filed with Japan Patent Office on Feb. 25, 2011, and Japanese Patent Application serial No. 2011-260520 filed with Japan Patent Office on Nov. 29, 2011, the entire contents of which are hereby incorporated by reference.

What is claimed is:

1. A display device comprising:
a pixel area comprising pixels arranged in a matrix, and having a horizontal resolution of 350 ppi or more, the pixels each comprising a first transistor, a second transistor, a capacitor and a light-emitting element; and
a color filter layer overlapping with the pixel area,
wherein in each of the pixels, the first transistor comprises a first region of a first single crystal semiconductor layer, the capacitor comprises a second region of the first single crystal semiconductor layer, and the second transistor comprises a second single crystal semiconductor layer which is spaced from the first semiconductor layer,
wherein a gate of the first transistor is electrically connected to a first line,
wherein the capacitor further comprises a portion of a conductive film over the first single crystal semiconductor layer,
wherein one of a source and a drain of the first transistor is electrically connected to a second line,
wherein a gate of the second transistor is electrically connected to the other of the source and the drain of the first transistor,
wherein one of a source and a drain of the second transistor is electrically connected to the light-emitting element,
wherein the other of the source and the drain of the second transistor is electrically connected to a third line,
wherein the conductive film extends substantially parallel to the first line,
wherein the conductive film intersects with the second line and the third line,
wherein the third line is separated from the conductive layer, and wherein the light-emitting element is configured to emit white light.

2. The display device according to claim 1,
wherein the first line is a scan line,
wherein the second line is a signal line,
wherein the third line is a current-supplying line, and
wherein the conductive film is a capacity wiring.

3. The display device according to claim 1,
wherein the first transistor and the second transistor are formed over a substrate,
wherein an insulating film is formed over the first transistor and the second transistor,
wherein the light-emitting element is formed over the insulating film, and
wherein the light-emitting element comprising a reflective electrode over the insulating film, a light-emitting layer over the reflective electrode and a light-transmitting electrode over the light-emitting layer.

4. The display device according to claim 1, further comprising a shutter panel provided on a side where light emitted by the light-emitting element is extracted,
wherein the shutter panel comprises a liquid crystal element.

5. The display device according to claim 4,
wherein the shutter panel further comprises a third transistor comprising a channel formation region comprising an oxide semiconductor.

6. An electronic device comprising the display device according to claim 1, and a battery.

7. A display device comprising:
a pixel area comprising pixels arranged in a matrix, and having a horizontal resolution of 350 ppi or more, the pixels each comprising a first transistor, a second transistor, a capacitor and a light-emitting element; and
a color filter layer overlapping with the pixel area,
wherein in each of the pixels, the first transistor comprises a first region of a first single crystal semiconductor layer, the capacitor comprises a second region of the first single crystal semiconductor layer, and the second transistor comprises a second single crystal semiconductor layer which is spaced from the first semiconductor layer,
wherein a gate of the first transistor is electrically connected to a first line,
wherein the capacitor further comprises a portion of a conductive film over the first single crystal semiconductor layer,
wherein one of a source and a drain of the first transistor is electrically connected to a second line,
wherein a gate of the second transistor is electrically connected to the other of the source and the drain of the first transistor,
wherein one of a source and a drain of the second transistor is electrically connected to the light-emitting element,
wherein the other of the source and the drain of the second transistor is electrically connected to a third line,
wherein the conductive film extends substantially parallel to the first line,
wherein the conductive film intersects with the second line and the third line,
wherein the third line is separated from the conductive layer, and
wherein the light-emitting element comprises a first light-emitting layer and a second light-emitting layer that emit lights of different colors.

8. The display device according to claim 7,
wherein the first line is a scan line,
wherein the second line is a signal line,
wherein the third line is a current-supplying line, and
wherein the conductive film is a capacity wiring.

9. The display device according to claim 7,
wherein the first transistor and the second transistor are formed over a substrate,
wherein an insulating film is formed over the first transistor and the second transistor,
wherein the light-emitting element is formed over the insulating film, and
wherein the light-emitting element comprising a reflective electrode over the insulating film, a light-emitting layer over the reflective electrode and a light-transmitting electrode over the light-emitting layer.

10. The display device according to claim 7, further comprising a shutter panel provided on a side where light emitted by the light-emitting element is extracted,
wherein the shutter panel comprises a liquid crystal element.

11. The display device according to claim 10,
wherein the shutter panel further comprises a third transistor comprising a channel formation region comprising an oxide semiconductor.

12. The display device according to claim 7,
wherein colors of lights emitted by the first light-emitting layer and the second light-emitting layer are complementary colors.

13. An electronic device comprising the display device according to claim 7, and a battery.

* * * * *